(12) United States Patent
Straw et al.

(10) Patent No.: US 8,314,410 B2
(45) Date of Patent: Nov. 20, 2012

(54) COMBINATION LASER AND CHARGED PARTICLE BEAM SYSTEM

(75) Inventors: Marcus Straw, Portland, OR (US);
Mark W. Utlaut, Scappoose, OR (US);
N. William Parker, Hillsboro, OR (US)

(73) Assignee: FEI Company, Hallsboro, OR (US)

( * ) Notice: Subject to any disclaimer, the term of this patent is extended or adjusted under 35 U.S.C. 154(b) by 21 days.

(21) Appl. No.: 13/082,372

(22) Filed: Apr. 7, 2011

(65) Prior Publication Data
US 2011/0248164 A1 Oct. 13, 2011

Related U.S. Application Data

(60) Provisional application No. 61/321,539, filed on Apr. 7, 2010.

(51) Int. Cl.
*H01J 37/26* (2006.01)
*H01J 3/14* (2006.01)
*H01J 37/00* (2006.01)

(52) U.S. Cl. ............... 250/492.3; 250/492.1; 250/492.2; 250/492.21; 250/493.1; 250/397; 250/398

(58) Field of Classification Search ............... 250/492.1, 250/492.2, 492.21, 492.3, 493.1, 398, 397; 216/63, 66; 430/5
See application file for complete search history.

(56) References Cited

U.S. PATENT DOCUMENTS

| | | | |
|---|---|---|---|
| 3,832,948 A | 9/1974 | Barker | |
| 5,221,422 A | 6/1993 | Das et al. | |
| 5,598,002 A | 1/1997 | Todokoro et al. | |
| 5,874,011 A | 2/1999 | Ehrlich | |
| 5,894,058 A | 4/1999 | Hatakeyama et al. | |
| 6,818,908 B2 | 11/2004 | Makimura | |
| 6,900,447 B2 | 5/2005 | Gerlach et al. | |
| 7,154,091 B2 | 12/2006 | Zewail et al. | |
| 8,059,918 B2* | 11/2011 | Young et al. | 382/294 |
| 8,115,180 B2* | 2/2012 | Doemer et al. | 250/442.11 |
| 8,134,124 B2* | 3/2012 | Blackwood et al. | 250/304 |
| 8,168,947 B2* | 5/2012 | Suhara | 250/306 |
| 8,168,961 B2* | 5/2012 | Straw et al. | 250/492.3 |
| 8,202,440 B1* | 6/2012 | Nasser-Ghodsi et al. | 216/63 |
| 2002/0170675 A1 | 11/2002 | Libby et al. | |
| 2006/0219953 A1* | 10/2006 | Carleson | 250/492.21 |
| 2006/0228634 A1* | 10/2006 | Bret et al. | 430/5 |
| 2007/0023654 A1* | 2/2007 | Kamimura et al. | 250/310 |

(Continued)

FOREIGN PATENT DOCUMENTS
EP 0927880 7/1999
(Continued)

*Primary Examiner* — David A Vanore
(74) *Attorney, Agent, or Firm* — Scheinberg & Associates, PC; Michael O. Scheinberg

(57) ABSTRACT

A combined laser and charged particle beam system. A pulsed laser enables milling of a sample at material removal rates several orders of magnitude larger than possible for a focused ion beam. In some embodiments, a scanning electron microscope enables high resolution imaging of the sample during laser processing. In some embodiments, a focused ion beam enables more precise milling of the sample. A method and structure for deactivating the imaging detectors during laser milling enables the removal of imaging artifacts arising from saturation of the detector due to a plasma plume generated by the laser beam. In some embodiments, two types of detectors are employed: type-1 detectors provide high gain imaging during scanning of the sample with an electron or ion beam, while type-2 detectors enable lower gain imaging and endpoint detection during laser milling.

35 Claims, 23 Drawing Sheets

U.S. PATENT DOCUMENTS

| | | | |
|---|---|---|---|
| 2008/0173814 A1* | 7/2008 | Watanabe et al. | 250/310 |
| 2008/0314871 A1 | 12/2008 | Toth et al. | |
| 2010/0044594 A1* | 2/2010 | Sullivan et al. | 250/492.3 |
| 2010/0127190 A1* | 5/2010 | Straw et al. | 250/492.3 |
| 2011/0031655 A1 | 2/2011 | Toth et al. | |
| 2011/0115129 A1* | 5/2011 | Straw et al. | 264/400 |
| 2011/0163068 A1* | 7/2011 | Utlaut et al. | 216/66 |
| 2011/0248164 A1* | 10/2011 | Straw et al. | 250/307 |
| 2012/0103945 A1 | 5/2012 | Straw et al. | |

FOREIGN PATENT DOCUMENTS

| | | |
|---|---|---|
| JP | 09306403 | 11/1997 |
| WO | 2010006067 | 1/2010 |
| WO | 2010006188 | 1/2010 |

\* cited by examiner

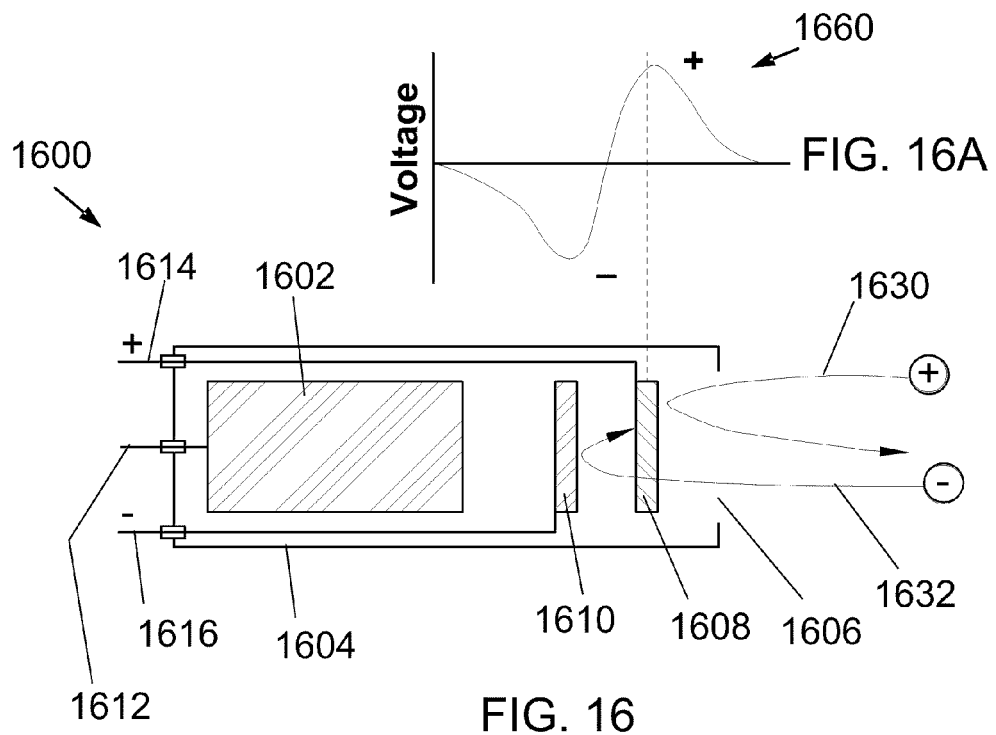
FIG. 16A
FIG. 16
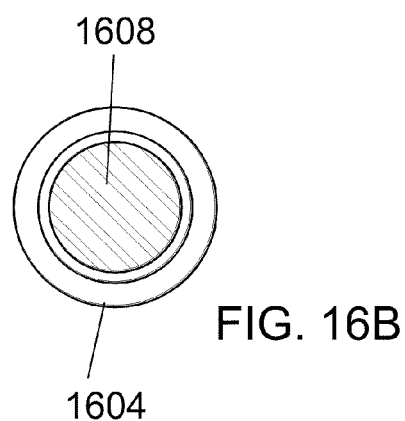
FIG. 16B

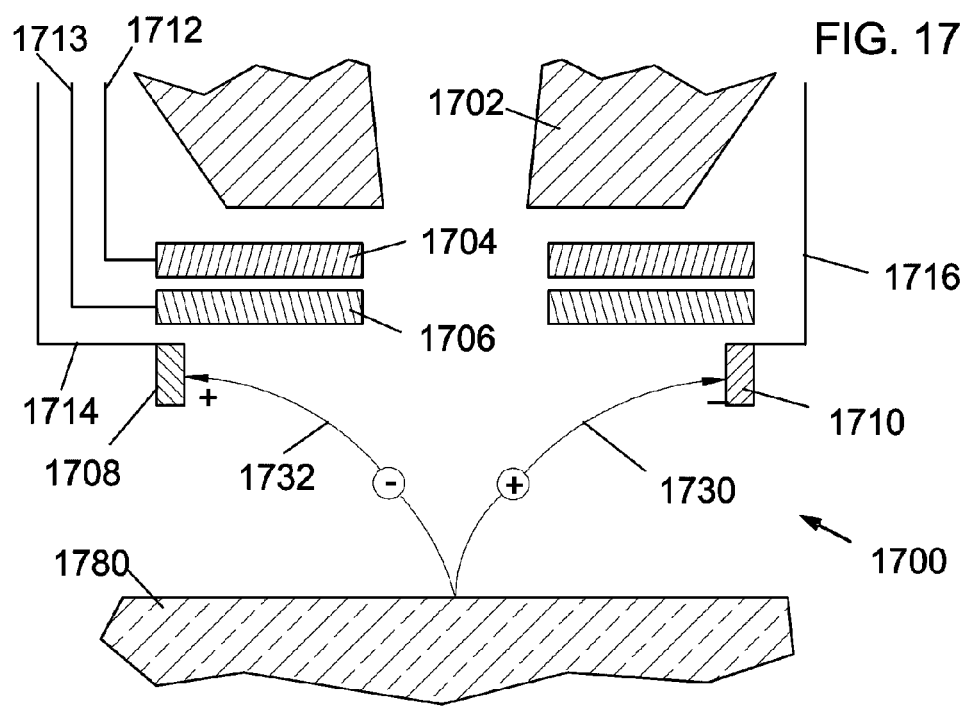
FIG. 17
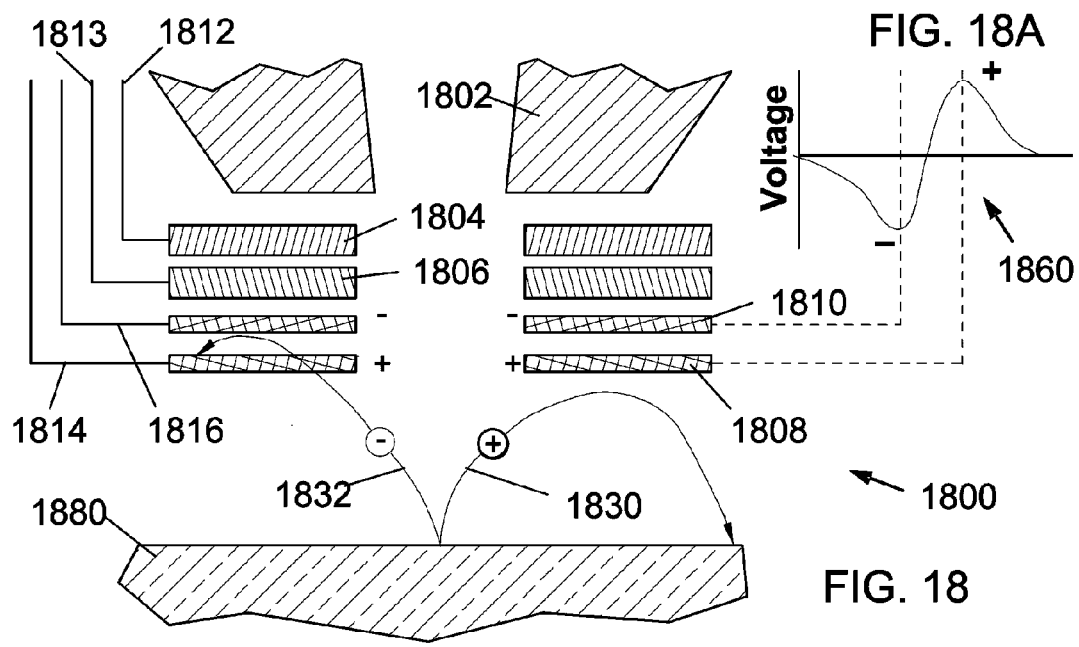
FIG. 18A
FIG. 18

COMBINATION LASER AND CHARGED PARTICLE BEAM SYSTEM

This application claims priority from U.S. Provisional Application 61/321,539, filed Apr. 7, 2010, which is hereby incorporated by reference.

TECHNICAL FIELD OF THE INVENTION

The present invention relates to a combination of a laser beam system with a charged particle beam system.

BACKGROUND OF THE INVENTION

Charged particle beam systems are used in a variety of applications, including the manufacturing, repair, and inspection of miniature devices, such as integrated circuits, magnetic recording heads, and photolithography masks. Charged particle beams include ion beams and electron beams.

Ions in a focused beam typically have sufficient momentum to micromachine by physically ejecting material from a surface. Because electrons are much lighter than ions, electron beams are typically limited to removing material by inducing a chemical reaction between an etchant vapor and the substrate. Both ion beams and electron beams can be used to image a surface at a greater magnification and higher resolution than can be achieved by the best optical microscopes.

Ion beam systems using gallium liquid metal ion sources (LMIS) are widely used in manufacturing operations because of their ability to image, mill, deposit, and analyze with great precision. Ion columns in FIB systems using gallium liquid metal ion sources (LMIS), for example, can provide five to seven nanometers of lateral resolution. Because ion beams tend to damage sample surfaces even when used to image, ion beam columns are often combined with electron beam columns in dual beam systems. Such systems often include a scanning electron microscope (SEM) that can provide a high-resolution image with minimal damage to the target, and an ion beam system, such as a focused or shaped beam system, that can be used to alter workpieces and to form images. Dual beam systems including a liquid metal focused ion beam and an electron beam are well known. For example, such systems include the Quanta 3D FEG™ System, available from FEI Company of Hillsboro, Oreg., the assignee of the present invention. The ion beam can be used, for example, to cut a trench in an integrated circuit, and then the electron beam can be used to form an image of the exposed trench wall.

Unfortunately, high-precision milling or sample removal often requires some tradeoffs. The processing rate of the liquid metal ion source is limited by the current in the beam. As the current is increased, it is harder to focus the beam into a small spot. Lower beam currents allow higher resolution, but result in lower erosion rates and hence longer processing times in production applications and in laboratories. As the processing rate is increased by increasing the beam current, the processing precision is decreased.

Further, even at higher beam currents, focused ion beam milling may still be unacceptably slow for some micromachining applications. Other techniques, such as milling with a femtosecond laser can also be used for faster material removal but the resolution of these techniques is much lower than a typical LMIS FIB system. Lasers are typically capable of supplying energy to a substrate at a much higher rate than charged particle beams, and so lasers typically have much higher material removal rates (typically up to $7\times10^6$ $\mu m^3/s$ for a 1 kHz laser pulse repetition rate) than charged particle beams (typically 0.1 to 3.0 $\mu m^3/s$ for a Gallium FIB). Laser systems use several different mechanisms for micromachining, including laser ablation, in which energy supplied rapidly to a small volume causes atoms to be explosively expelled from the substrate. All such methods for rapid removal of material from a substrate using a laser beam will be collectively referred to herein as laser beam milling.

FIG. 1 is a schematic illustration 10 of a prior art laser ablating a surface. When a high power pulsed laser 12 producing laser beam 13 is focused onto a target material 14 supported by a stage 15 and the laser fluence exceeds the ablation threshold value for the material, chemical bonds in the target material are broken and the material is fractured into energetic fragments, typically a mixture of neutral atoms, molecules, and ions, creating a plasma plume 16 above the material surface. Since the material leaves the reaction zone as an energetic plasma, gas, and solid debris mixture, the ablation process resembles explosive evaporation of the material that propels material fragments 18 up and away from the point where the laser beam 13 is focused.

As compared to charged particle beam processing, laser ablation is capable of removing a relatively massive amount of material very quickly, with material removal rates more than $10^6\times$ faster than a Ga FIB. The wavelength of lasers, however, is much larger than the wavelength of the charged particles in the charged particle beams. Because the size to which a beam can be focused is, in part, limited by the beam wavelength (especially for diffraction-limited optics), the minimum spot size of a laser beam is typically larger than the minimum spot size of a charged particle beam. Thus, while a charged particle beam typically has greater resolution than a laser beam and can micromachine extremely small structures, the beam current is limited and the micromachining operation can be unacceptably slow. Laser micromachining, on the other hand, is generally much faster, but the resolution is inherently diffraction-limited by the longer beam wavelength.

The combination of a charged particle beam system with a laser beam system can demonstrate the advantages of both. For example, combining a high resolution LMIS FIB with a femtosecond laser allows the laser beam to be used for rapid material removal and the ion beam to be used for high precision micromachining in order to provide an extended range of milling applications within the same system. The combination of an electron beam system, either alone or in conjunction with a FIB, allows for nondestructive imaging of a sample.

A combination of focused ion beam processing with laser machining is described, for example, in U.S. patent application Ser. No. 12/324,296 by Straw et al., for "Charged Particle Beam Masking for Laser Ablation Micromachining" (Nov. 26, 2008), which is assigned to the assignee of the present invention and is hereby incorporated by reference. U.S. patent application Ser. No. 12/324,296 is not admitted to be prior art by its inclusion in this Background section.

It is known to use optical fibers to couple lasers into charged particle beam systems. However, optical fibers cannot be used to deliver ultrashort (i.e., pulses shorter than 10 ps) laser pulses. This is because weakly coupled single mode fibers compromise the pulse duration due to group velocity dispersion, while single mode fibers that are well coupled to the laser pulses are damaged by the high peak powers achievable by relatively low energy ultrashort pulses.

What is needed is an improved method and apparatus for introducing a laser beam into a charged particle beam system, such as a FIB or SEM, so that the laser beam is coincident, coaxial, or adjacent to the charged particle beam.

SUMMARY OF THE INVENTION

An object of the invention is to provide an improved method and apparatus for introducing a laser beam into a charged particle beam system. According to preferred embodiments of the present invention, the laser beam can be introduced into the vacuum chamber of a charged particle system by way of a transparent "window" and focused onto a sample by one or more lenses and/or parabolic mirrors, preferably so that the laser beam and charged particle beam are coincident. In some preferred embodiments, the focusing lens or mirror can be formed with a hole to pass the charged particle beam so that the charged particle beam and the laser beam can be both coaxial and confocal.

Another object of the invention is to provide a method for preventing imaging detectors ("type-1" detectors) from saturating due to charged particles generated by laser milling of a sample surface.

A further object of the invention is to provide a second set of detectors ("type-2" detectors) which are activated only during laser milling and while the plasma plume generated by the laser is dissipating. The output signals from the type-2 detectors may be used to provide endpoint detection for the laser milling process, as well as a signal indicating that the plasma plume has dissipated enough to reactivate the imaging detectors and continue with the imaging raster, until the laser is ready to fire another pulse at the sample.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which:

FIG. 16 illustrates the operation of detector deactivating grids in another preferred embodiment off-axis type-1 detector;

FIG. 16A is a schematic graph of the voltage along the axis of the detector assembly in the preferred embodiment of FIG. 16.

FIG. 16B is an end view of the detector assembly in the preferred embodiment of FIG. 16.

FIG. 17 illustrates the operation of detector deactivating plates in a preferred embodiment of a type-1 detector located below a charged particle column;

FIG. 18 illustrates the operation of detector deactivating grids in another preferred embodiment of a type-1 detector located below a charged particle column;

FIG. 18A is a schematic graph of the voltage along the axis of the detector assembly in the preferred embodiment of FIG. 18.

Figure 1:
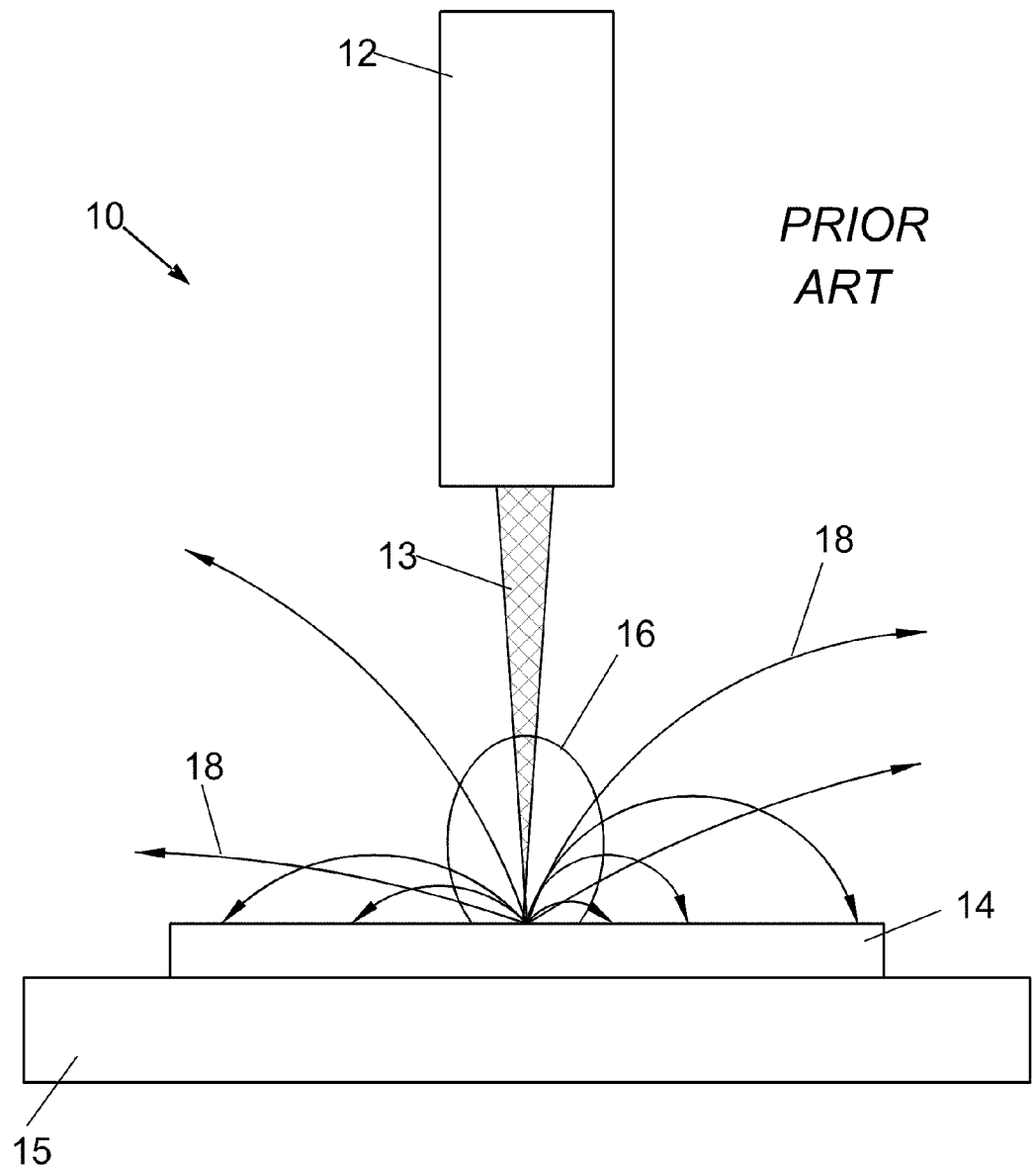
FIG. 1 is a schematic illustration of a prior art laser ablating a surface.

The accompanying drawings are intended to aid in understanding the present invention and, unless otherwise indicated, are not drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

Preferred embodiments of the present invention provide an improved apparatus for introducing an ultrashort-pulsed laser into a charged particle beam system. The combination of a laser with a charged particle beam system provides a number of advantages over either system standing alone. For example, combining a high resolution liquid metal ion source (LMIS) FIB with a femtosecond laser allows the laser beam to be used for rapid material removal and the ion beam to be used for high precision micromachining in order to provide an extended range of milling applications within the same system. Preferred embodiments of the present invention provide a number of methods one might use in chamber optics to combine a laser beam with a charged particle beam. In some embodiments listed below, the laser beam is brought into the vacuum chamber via a window formed from a material that is transparent to the laser beam. Other preferred embodiments in which the laser is located within the vacuum chamber are also within the scope of the present invention.

Although those of ordinary skill in the art will readily recognize many alternative embodiments, especially in light of the illustrations provided herein, this detailed description is exemplary of the preferred embodiments of the present invention, the scope of which is limited only by the appended claims. A preferred method or apparatus of the present invention has many novel aspects, and because the invention can be embodied in different methods or apparatuses for different purposes, not every aspect need be present in every embodiment. Moreover, many of the aspects of the described embodiments may be separately patentable.

Figure 2:
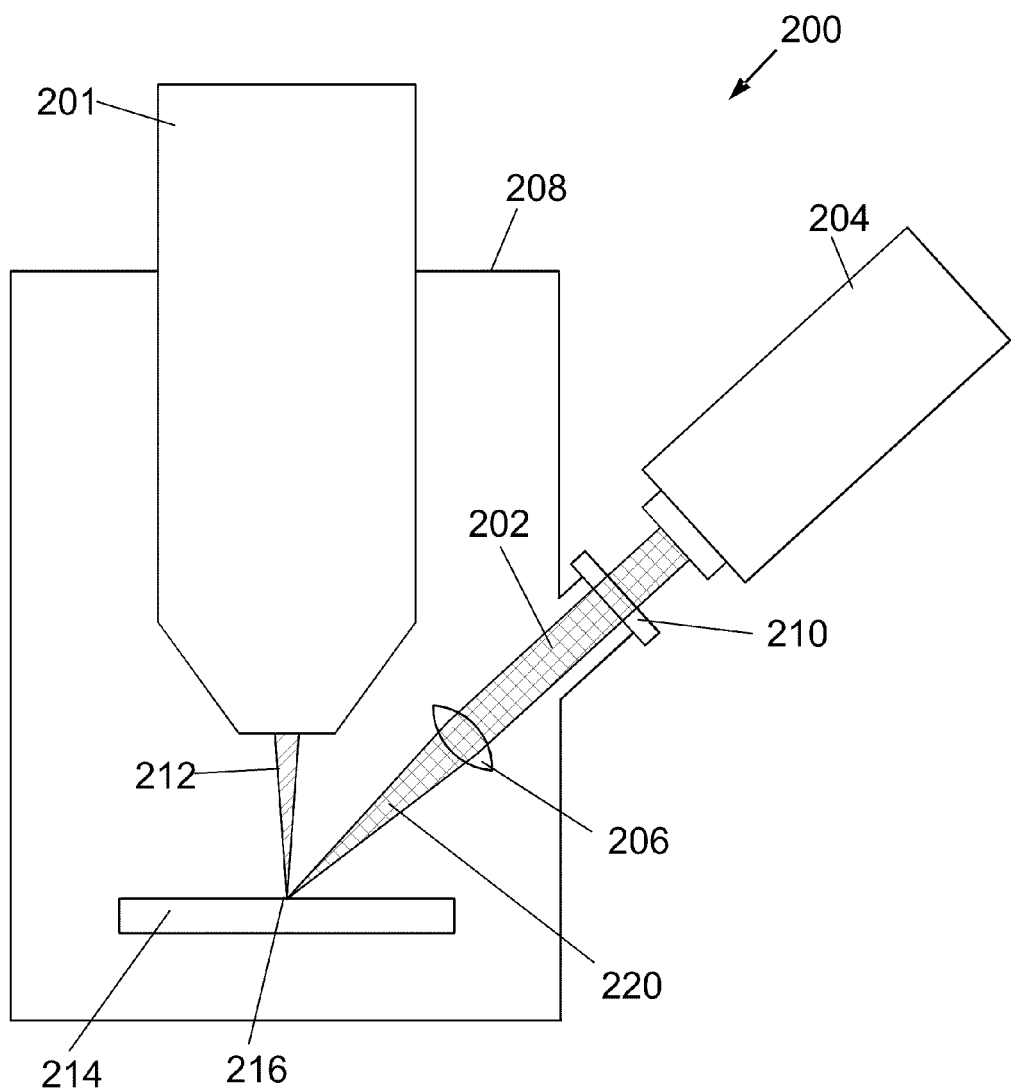
FIG. 2 is a schematic illustration of a combination SEM and laser according a preferred embodiment of the present invention.

FIG. 2 shows a preferred embodiment 200 of the invention comprising a combination charged particle beam column 201 and laser 204. As shown in the schematic drawing of FIG. 2, the laser beam 202 from laser 204 is focused by lens 206 located inside the vacuum chamber 208 into a converging laser beam 220. The laser beam 202 enters the chamber through a window 210. In the embodiment of FIG. 2, a single lens 206 or group of lenses (not shown) located adjacent to the charged particle beam 212 is used to focus the laser beam 220 such that it is either coincident and confocal with, or adjacent to, the charged particle beam 212 (produced by charged particle beam focusing column 201) as it impacts the sample 214 at location 216.

Figure 3A:
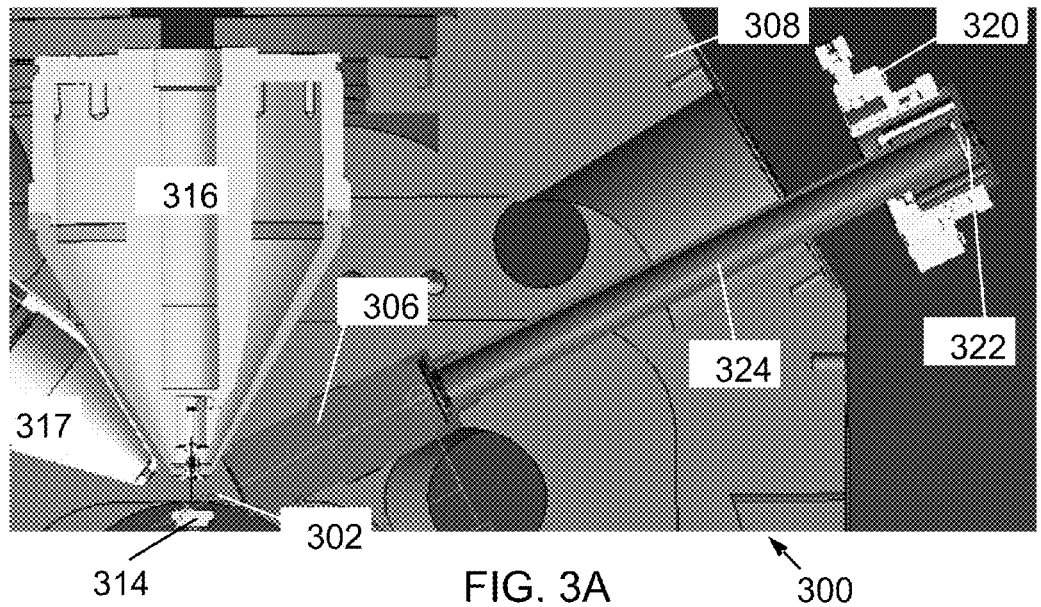
FIGS. 3A and 3B show a combination dual beam FIB/SEM with a confocal laser according to a preferred embodiment of the present invention.
Figure 3B:
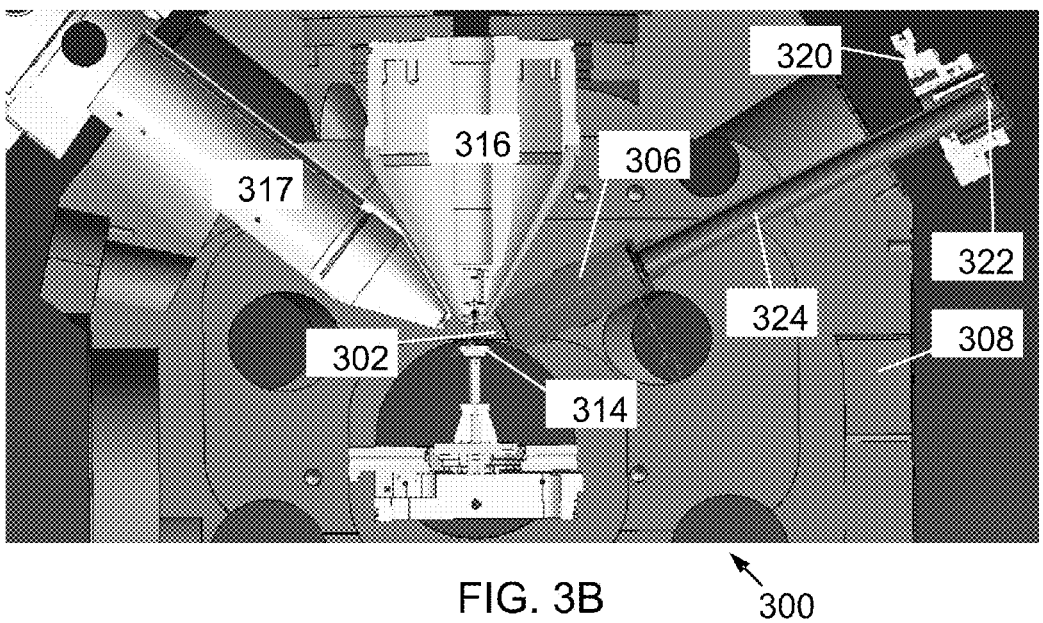

FIGS. 3A and 3B show a preferred embodiment 300 of the invention comprising a combination dual beam FIB/SEM with a confocal laser. As in FIG. 2, the laser beam 302 from a laser (not shown) is focused by lens 306 located inside the vacuum chamber 308. In the embodiment of FIG. 3, the positioning and focusing of laser beam 302 can be controlled via lens positioning assembly 320 ("LPA"), which can be used to adjust the position (in X, Y, and Z) of the lens 306. A beam generated by a laser can be directed through the LPA window 322 so that it passes through LPA tube 324 and lens 306. Charged particle beams produced by electron beam column 316 and focused ion beam column 317 can be coincident with the laser beam 302 on sample 314.

Figure 4A:
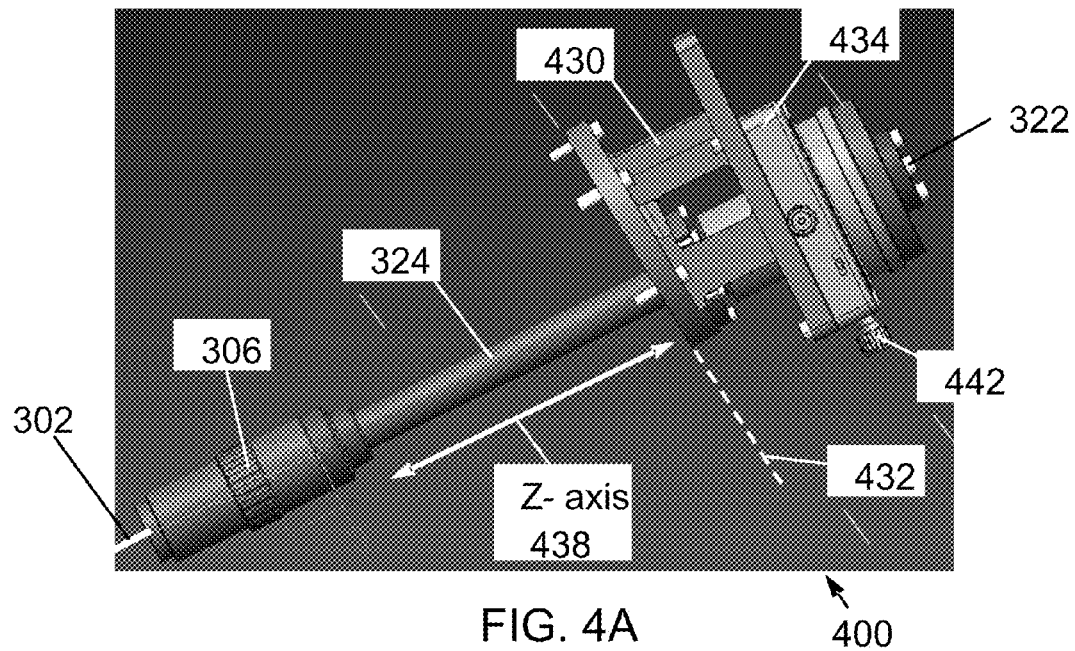
FIGS. 4A-4B show a laser focusing lens positioning assembly for use with the embodiment of FIGS. 3A-3B.
Figure 4B:
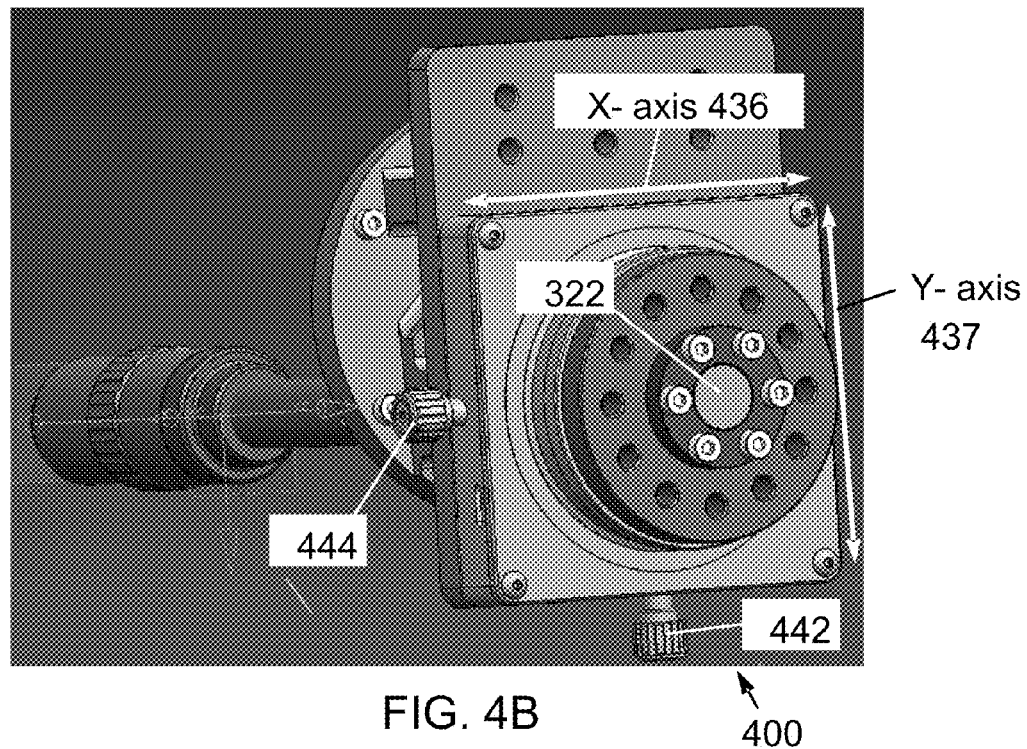
Figure 5:
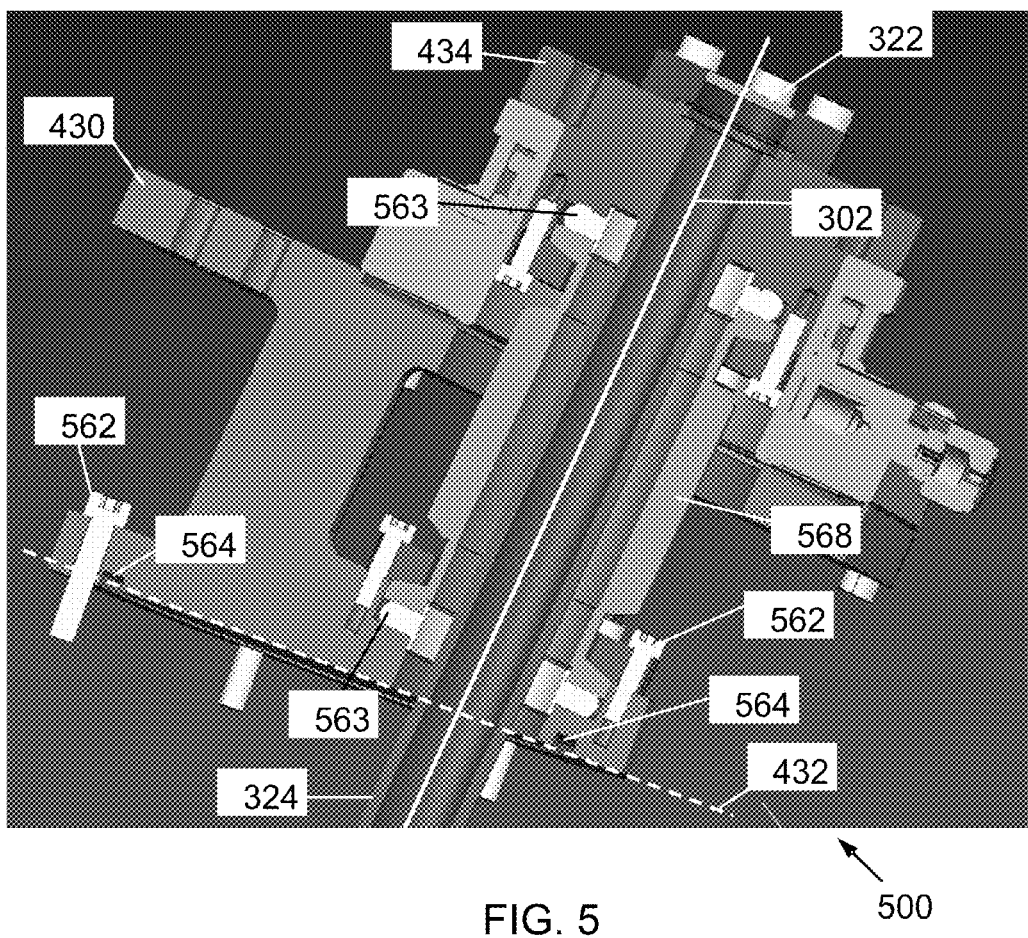
FIG. 5 shows a cross section of the lens positioning assembly of FIGS. 4A-4B.

LPA 320 is shown 400 in greater detail in FIGS. 4A-4B. The adjustment head 430 of the LPA can be mounted to the outer wall of the vacuum chamber (as shown by dashed line 432). XYZ-positioner 434 can be used to adjust the position of the lens and lens tube assembly along the X-axis (436), Y-axis (437), and Z-axis (438). In the illustrated embodiment, manual adjustment knobs 442 and 444 can be used to adjust the lens assembly along the X- and Y-axes, while rotating adjuster 446 can be manually rotated to move the lens in and out along the Z-axis. The adjustments in X and Y allow the laser beam to be positioned on the sample so that it is coincident with one or both of the charged particle beams. The adjustments in Z allow the beam to be precisely focused onto the sample. Referring also to FIG. 5, bellows 568 enable Z-adjustment while maintaining vacuum in the lens tube assembly. Persons of skill in the art will recognize that, while manual adjustment means are illustrated in FIGS. 4A-4B, automatic adjustment would also be possible using known methods.

FIG. 5 shows a cross section of LPA 320. Laser beam 302 travels through window 322 and through tube 324. Adjustment head 430 can be attached to the outer wall of the vacuum chamber 432 via bolts 562. Cavity 564 can be provided for an O-ring or similar seal to help seal the connection between the adjustment head and the outer wall of the vacuum chamber. Similarly, O-rings 563 at the top and bottom of bellows 568 provide a vacuum seal for the interior of the lens tube assembly.

Figure 6:
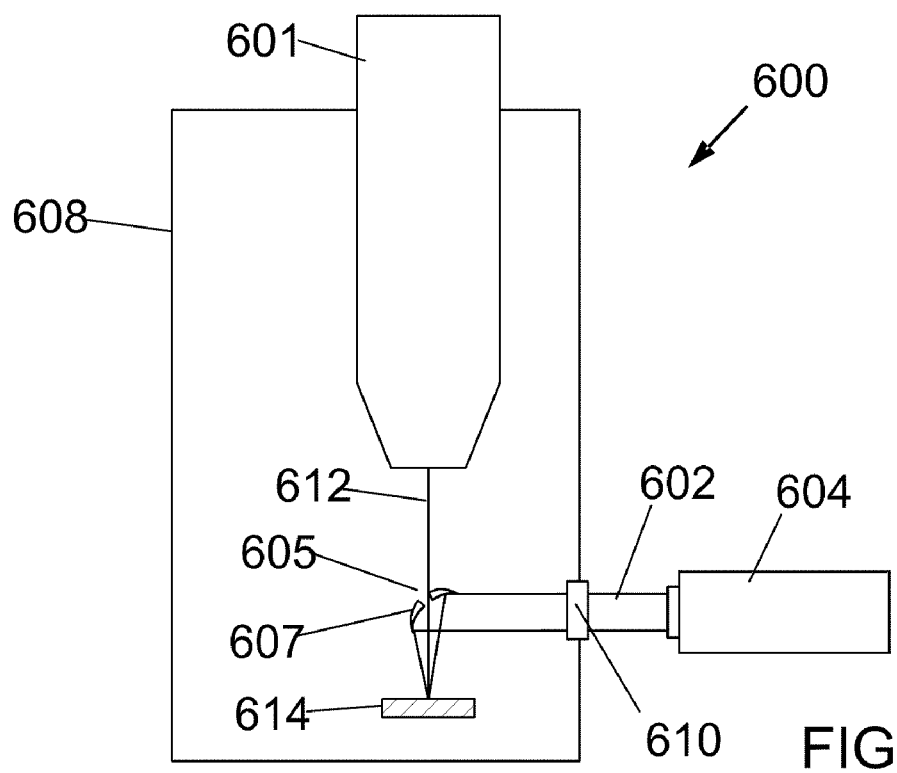
FIG. 6 shows another preferred embodiment of the present invention, in which a laser beam is combined with a charged particle beam via the implementation of a parabolic mirror located between the source of the charged particles and the sample.

FIG. 6 shows another preferred embodiment 600 of the present invention, in which a laser beam 602 could be combined with a charged particle beam 612 via the implementation of a parabolic mirror 607 located between the source of the charged particle beam 612 (column 601) and the sample 614. The parabolic mirror 607 would preferably have a hole 605 in it to allow the charged particle beam 612 to pass through the mirror and arrive at the sample. The laser beam 602 (generated by laser 604 and entering chamber 608 through window 610) would be simultaneously reflected and focused by the mirror 607 onto the sample 614 such that the laser beam 602 and the charged particle beam 612 would be coaxial and confocal.

Figure 7:
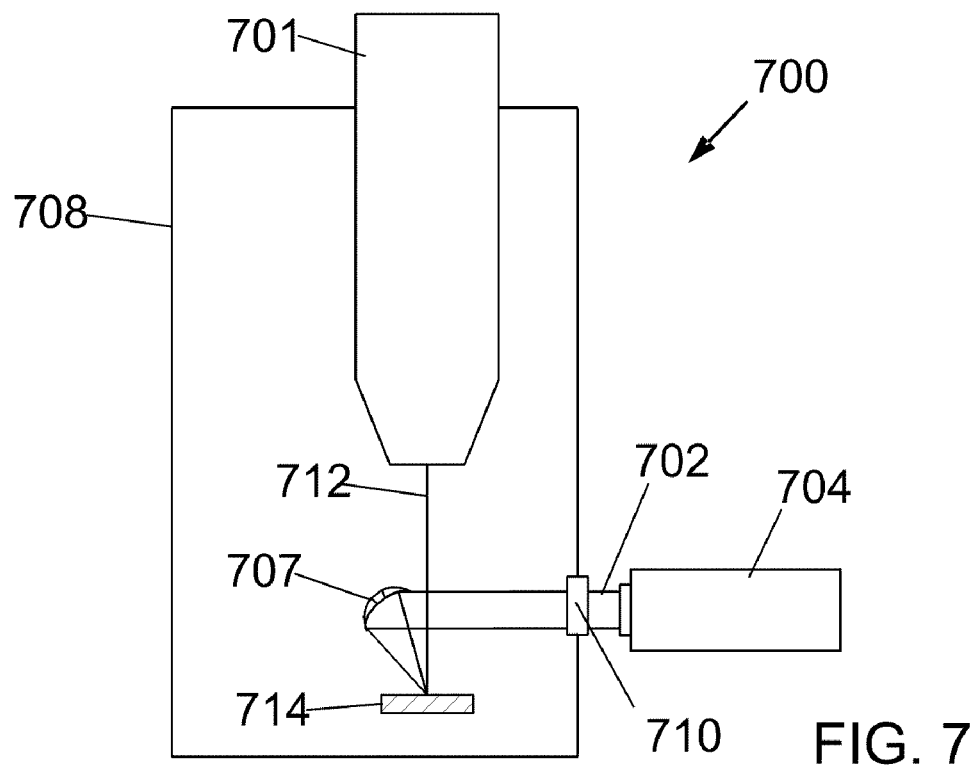
FIG. 7 shows another preferred embodiment of the present invention, in which a parabolic mirror is located adjacent to the charged particle beam.

FIG. 7 shows another preferred embodiment 700 of the present invention, in which the parabolic mirror 707 could be located adjacent to the charged particle beam 712 produced by column 701. In this case, mirror 707 would not need to have a hole in it. The laser beam 702 (generated by laser 704 and entering chamber 708 through window 710) could be reflected and focused on the sample 714 such that it is either coincident and confocal with, or adjacent to, the charged particle beam 712.

Figure 8:
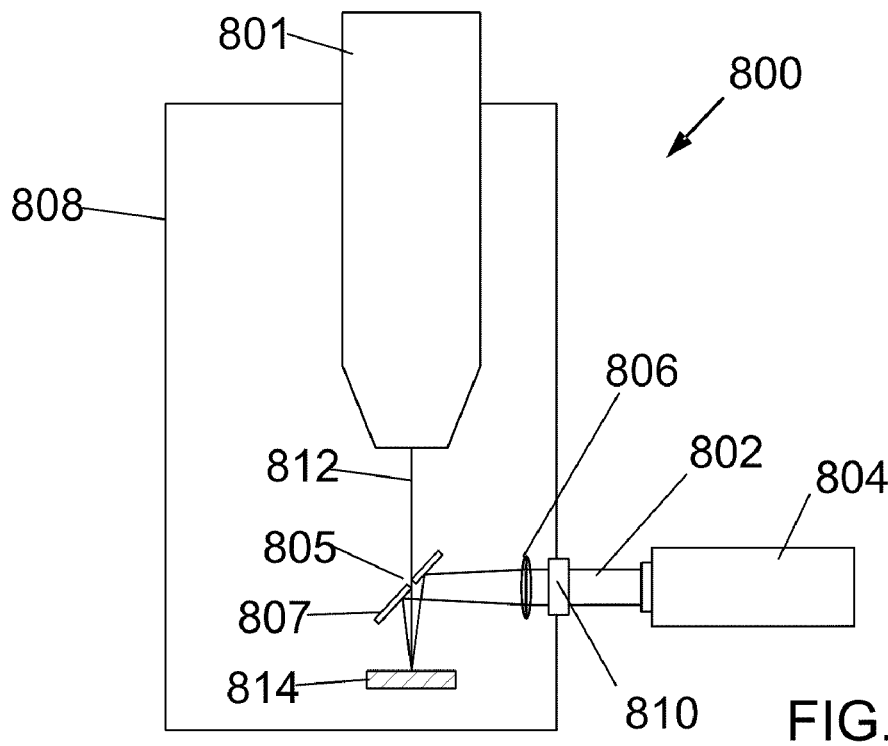
FIG. 8 shows another preferred embodiment of the present invention, in which a flat mirror is located between the source of the charged particles and the sample.

In another preferred embodiment 800, as shown in FIG. 8, a flat mirror 807 could be located between the source of the charged particle beam 812 (column 801) and the sample 814. Again, mirror 807 would preferably have a hole 805 to allow charged particle beam 812 to pass through the mirror 807 and arrive at the sample 814. In this case, the laser beam 802 (generated by laser 804 and entering chamber 808 through window 810) could be focused by a lens 806 (or by a group of lenses) before reaching the mirror 807. Relative to lens 806 (or group of lenses), mirror 807 would preferably be located between the lens 806 and its focal point at the surface of the sample 814. Thus, the laser beam 802 and the charged particle beam 812 would again be both coaxial and confocal.

Figure 9:
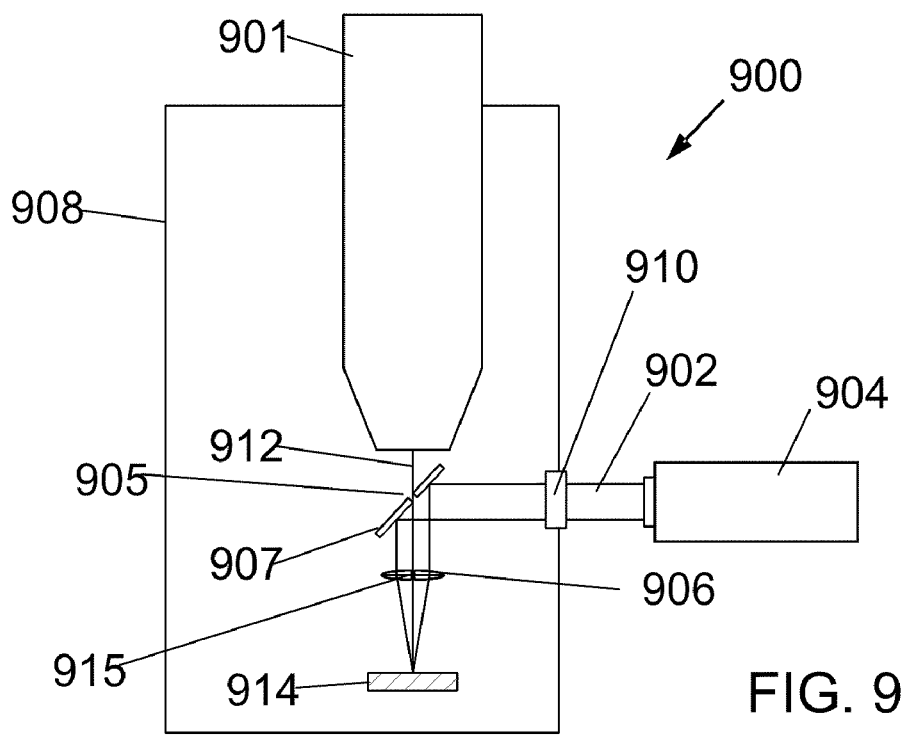
FIG. 9 shows another preferred embodiment of the present invention, in which a lens with a hole in it is located below a flat mirror, the lens thus focusing the laser beam onto the sample while still allowing the passage of charged particles.

In the preferred embodiment 900 of FIG. 9, a lens 906 with a hole 915 in it could be located below the flat mirror 907 (also having a hole 905), the lens 906 thus focusing the laser beam 902 (generated by laser 904 and entering chamber 908 through window 910) onto the sample 914 while still allowing the passage of charged particle beam 912 (produced by column 901). This configuration could also make the laser beam 902 and the charged particle beam 912 both coaxial and confocal.

Figure 10:
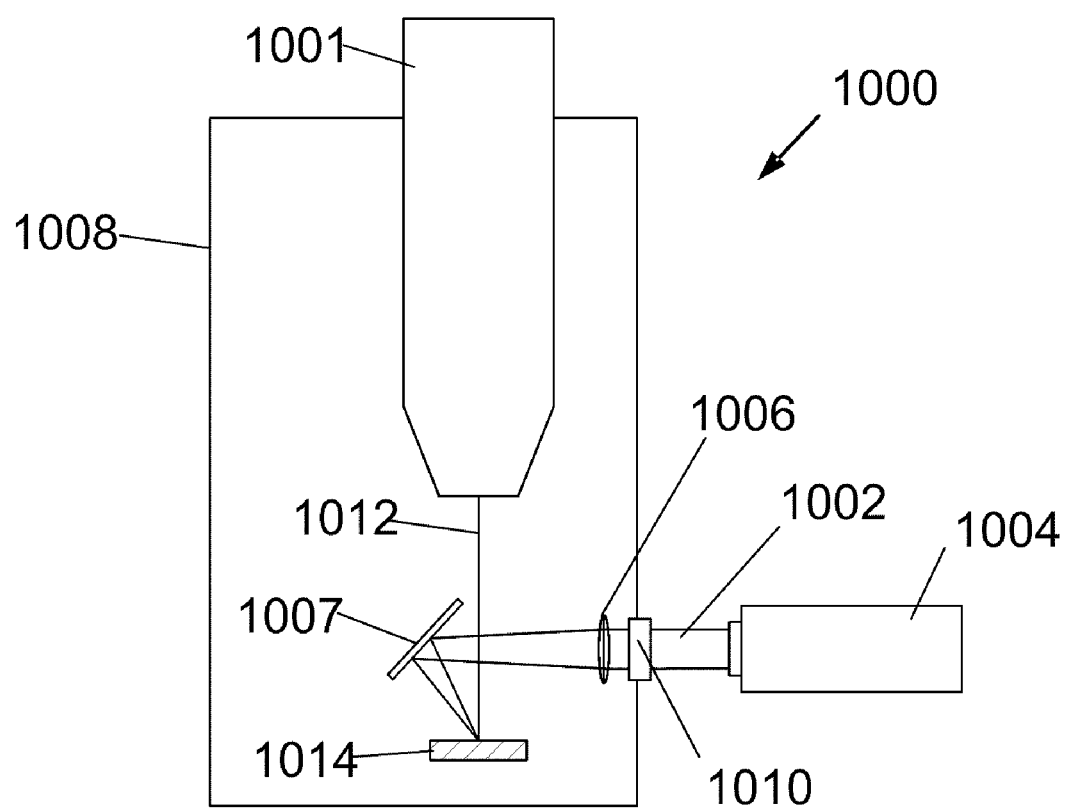
FIG. 10 shows another preferred embodiment of the present invention, in which a flat mirror is located adjacent to the charged particle beam.

In the preferred embodiment 1000 shown in FIG. 10, a flat mirror 1007 could be located adjacent to the charged particle beam 1012 (produced by column 1001). No hole in mirror 1007 is necessary in this case. The laser beam 1002 (generated by laser 1004 and entering chamber 1008 through window 1010) is preferably focused onto the sample 1014 by a lens 1006 located either between the laser 1004 and the mirror 1007 or between the mirror 1007 and the sample 1014. If the lens 1006 is located between the laser 1004 and the mirror 1007, the mirror 1007 should preferably be located between the lens 1007 and its focal point on the sample surface 1014. In this embodiment, the laser beam 1002 could be made either coincident & confocal with, or adjacent to, the charged particle beam 1012 on the sample surface.

In still another preferred embodiment, the lens or group of lenses located adjacent to the charged particle beam is preferably a telecentric lens (f-theta). Combined with a scanning mirror or a group of scanning mirrors located between the laser source and the lens, this configuration can provide for patterning and/or scanning of the laser beam.

In any of the preferred embodiments described above that include mirror configurations without lenses between the mirror and the sample, the mirrors could be moved remotely in such a way as to provide patterning and/or scanning of the laser beam. Additional mirrors could be added to provide additional degrees of freedom for alignment or patterning/scanning. Further, in any of the preferred embodiments described above that include a lens or a group of lenses as the final optical element between the laser beam and the sample, the lens could be moved to remotely in such a way as to provide patterning and/or scanning of the laser beam.

Figure 11:
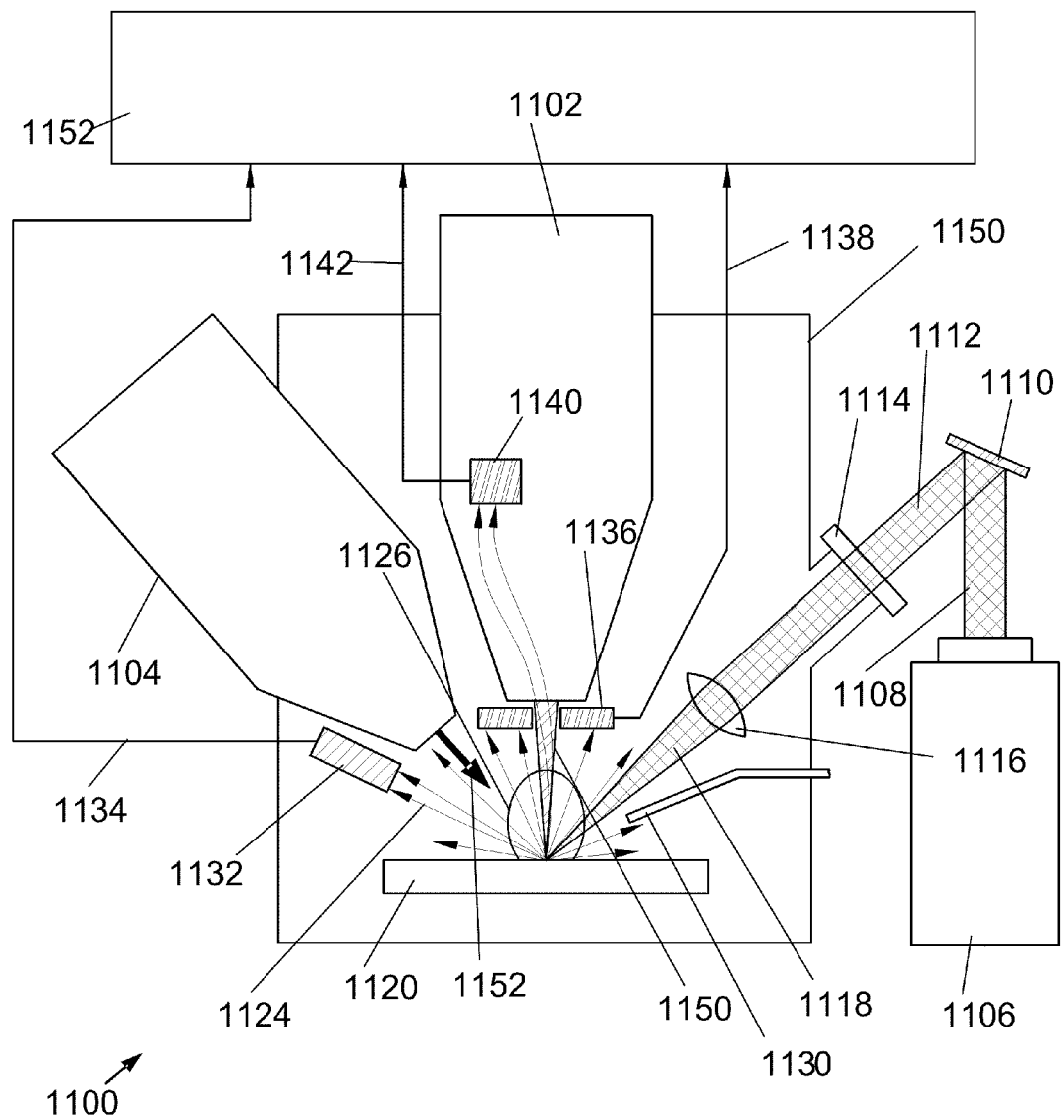
FIG. 11 shows a system according to a preferred embodiment of the present invention that combines a laser for rapid material removal with a FIB for further material processing, a SEM for monitoring the material removal process, with a plurality of type-1 detectors.

FIG. 11 shows a system 1100 according to a preferred embodiment of the present invention that combines a focused laser beam 1118 (produced by a laser 1106) for rapid material removal with a focused ion beam (FIB) 1152 (produced by a FIB column 1104) for further material processing and an electron beam 1150 (produced by a SEM column 1102) for monitoring the material removal process. A laser 1106 directs a laser beam 1108 towards a mirror 1110, which reflects the laser beam 1108 to form reflected beam 1112 directed through transparent window 1114 in vacuum chamber 1150. By "transparent" it is meant that the window is transparent to wavelengths of the particular type of laser being used. Mirror 1110 (or a similar reflecting element) can also be used to adjust the position of the laser beam 1118 on the sample 1120. A lens 1116 focuses the laser beam 1112 (which may be substantially parallel) into a focused laser beam 1118 with a focal point at or near to the surface of a sample 1120. Laser beam 1118 is preferably capable of being operated at a fluence greater than the ablation threshold of the material in sample 1120 being machined. Embodiments of the invention could use any type of laser, now existing or to be developed, that supplies sufficient fluence. A preferred laser provides a short, nanosecond to femtosecond, pulsed laser beam. Suitable lasers include, for example, a Ti:Sapphire oscillator or amplifier, a fiber-based laser, or an ytterbium- or chromium-doped thin disk laser.

The ablation threshold is an intrinsic property of the substrate material, and skilled persons can readily determine empirically or from the literature the ablation threshold for various materials. A silicon substrate, for example, has a single pulse ablation threshold of about 170 $mJ/cm^2$, and so the laser fluence should preferably be just above this value for micromachining silicon in accordance with preferred embodiments of the present invention. A preferred laser beam has energy in the range of 10 nJ to 1 mJ, and a fluence in the range of 0.1 $J/cm^2$ to 100 $J/cm^2$. In one preferred embodiment for milling a silicon substrate, the laser beam has a fluence of 190 $mJ/cm^2$, a pulse duration of 150 femtoseconds, and a spot size of 2 μm. In another embodiment, a laser beam has a pulse energy of 50 nJ and a fluence of 0.4 $J/cm^2$.

Sample 1120 is typically positioned on a precision stage (not shown), which preferably can translate the sample in the X-Y plane, and more preferably can also translate the work piece in the Z-axis, as well as being able to tilt and rotate the sample for maximum flexibility in fabricating three-dimensional structures. System 1100 optionally includes one or more charged particle beam columns, such as an electron beam column 1102, an ion beam column 1104, or both, which can be used for imaging the sample to monitor the laser ablation process, or for other processing (such as FIB-milling) or imaging tasks. Ion beam column 1104 typically forms a beam of ions 1152 which may be focused onto the sample surface 1120 at or near the focal point of the laser beam 1118. FIB column 1104 may also be capable of scanning ion beam 1152 on the substrate surface to perform imaging and/or FIB milling. System 1100 may also include a gas injection 1130 system for supplying a precursor gas that reacts with the substrate 1120 in the presence of the electron beam 1150 or focused ion beam 1152.

As is well-known in the prior art, the electron beam column 1102 comprises an electron source (not shown) for producing electrons and electron-optical lenses (not shown) for forming a finely focused beam of electrons 1150 which may be used for SEM imaging of the sample surface 1120. The beam of electrons 1150 can be positioned on, and can be scanned over, the surface of the sample 1120 by means of a deflection coil or plates (not shown). Operation of the lenses and deflection coils is controlled by power supply and control unit (not shown). It is noted that the lenses and deflection unit may manipulate the electron beam through the use of electric fields, magnetic fields, or a combination thereof.

Sample chamber 1150 preferably includes one or more gas outlets for evacuating the sample chamber using a high vacuum and mechanical pumping system under the control of a vacuum controller (not shown). Sample chamber 1150 also preferably includes one or more gas inlets through which gas can be introduced to the chamber at a desired pressure.

The laser beam 1118 is typically a pulsed laser beam, preferably with a repetition rate between 100 Hz and 10 kHz, and more preferably with a repetition rate between 500 Hz and 1500 Hz. During operation of the laser, a mixture 1124 of neutral atoms, molecules, electrons, and ions, exits the surface of sample 1120 due to the impact of laser beam 1118 creating a plasma plume 1126 above the sample surface 1120. Since the material leaves the reaction zone as a mixture of energetic plasma, gas, and solid debris, the ablation process resembles explosive evaporation of the material and propels material fragments 1124 up and away from the point where the laser beam 1118 is focused.

This sudden generation of large numbers of electrons and ions (the plasma plume) may tend to saturate any charged particle detectors used for imaging. Charged particle beam systems typically employ one or more detectors for secondary particles which are generated by the impact of the charged particle beam with the sample. These detectors are often characterized by high signal gains, typically necessary to provide high enough signal-to-noise ratios for rapid imaging of the sample. The relatively large flux of charged particles produced by the ablation process will tend to saturate these secondary particle imaging detectors for an appreciable period (e.g., >10 µs). This saturation may result in artifacts (e.g., white spots or streaks) which degrade images of the substrate taken synchronously with laser milling.

One object of preferred embodiments of the present invention is the prevention of this saturation of the charged particle detectors, characterized as "type-1 detectors" herein. Type-1 detectors are defined as detectors (typically with gains above 1000x) configured to detect one of more of the secondary electrons, secondary ions, or backscattered electrons emitted from the sample due to the impact of a charged particle beam. These signal currents are typically orders-of-magnitude lower than the currents 1124 of electrons and ions produced by the laser beam 1118. Thus applicants have found that if type-1 detectors are exposed to the particle currents 1124 due to laser ablation, signal saturation and/or damage to the type-1 detectors may occur. It is thus an object of preferred embodiments of the present invention to prevent this signal saturation and/or damage to the plurality of type-1 detectors found in a typical charged particle imaging and/or processing system such as system 1100.

In FIG. 11, a plurality of type-1 detectors comprises detectors 1132, 1136, and 1140. A first type-1 detector 1132 is preferably located to the side of the FIB beam 1152, the electron beam 1150, and the laser beam 1118, and is exposed to a portion of the electrons and/or ions generated by the impact of laser beam 1118 with the sample 1120. Examples of a suitable detector type include a scintillator-photomultiplier detector, a channeltron, or a solid-state (P-I-N diode) detector. Another type-1 detector 1136 is preferably located at the bottom of the SEM column 1102. Detector 1136 could comprise, for example, a channel electron multiplier plate with a center hole for passage of electron beam 1150 to the sample 1120. Still another type-1 detector 1140 is preferably mounted within SEM column 1102. Detector 1140 could comprise, for example, a scintillator-photomultiplier detector. A typical system 1100 may include one or more type-1 detectors in each location 1132, 1136, and 1140. Detectors 1132, 1136, and 1140 are preferably connected to a type-1 detector controller 1152 by cables 1134, 1138, and 1142, respectively. Type-1 detector controller 1152 enables the activation of the type-1 detectors when there is no laser beam 1118 or plasma plume 1126 present in the system, and also the deactivation of the type-1 detectors just before firing a laser pulse. This is described in more detail below with reference to FIG. 12.

Various methods for deactivating the type-1 detectors can be employed, including, but not limited to:

1) applying a repelling bias voltage to the collection surface of the type-1 detector, thereby preventing the collection of particles;
2) applying a repelling bias voltage to a screen or grid structure mounted near or across the collection surface of the type-1 detector, thereby preventing the collection of particles;
3) turning off one or more internal voltages within the type-1 detector, thereby reducing or eliminating the gain of the detector (e.g., the bias voltage on a photo-multiplier tube, or the bias voltage across a channeltron or multichannel plate); or
4) applying a voltage to one or more deflection electrodes mounted between the sample and the type-1 detector in order to prevent the transmission of particles to the detector collection surface.

Methods for activating the type-1 detectors would essentially be the opposite of the above possibilities, in all cases resulting in the type-1 detectors again being capable of collecting secondary and/or backscattered-particles from the sample. It is preferably that the method and structure for enabling type-1 detector deactivation and activation have a rapid cycle time so that it is possible to rapidly switch between the deactivated and activated states of the type-1 detectors. Typical type-1 detector activation and deactivation times may range from 100 ns to 10 µs, and more preferably between 100 ns and 2 µs. FIGS. 15-18 illustrate exemplary structures and voltages for detector deactivation and activation for type-1 detectors located both off-axis and below the charged particle column.

Figure 12:
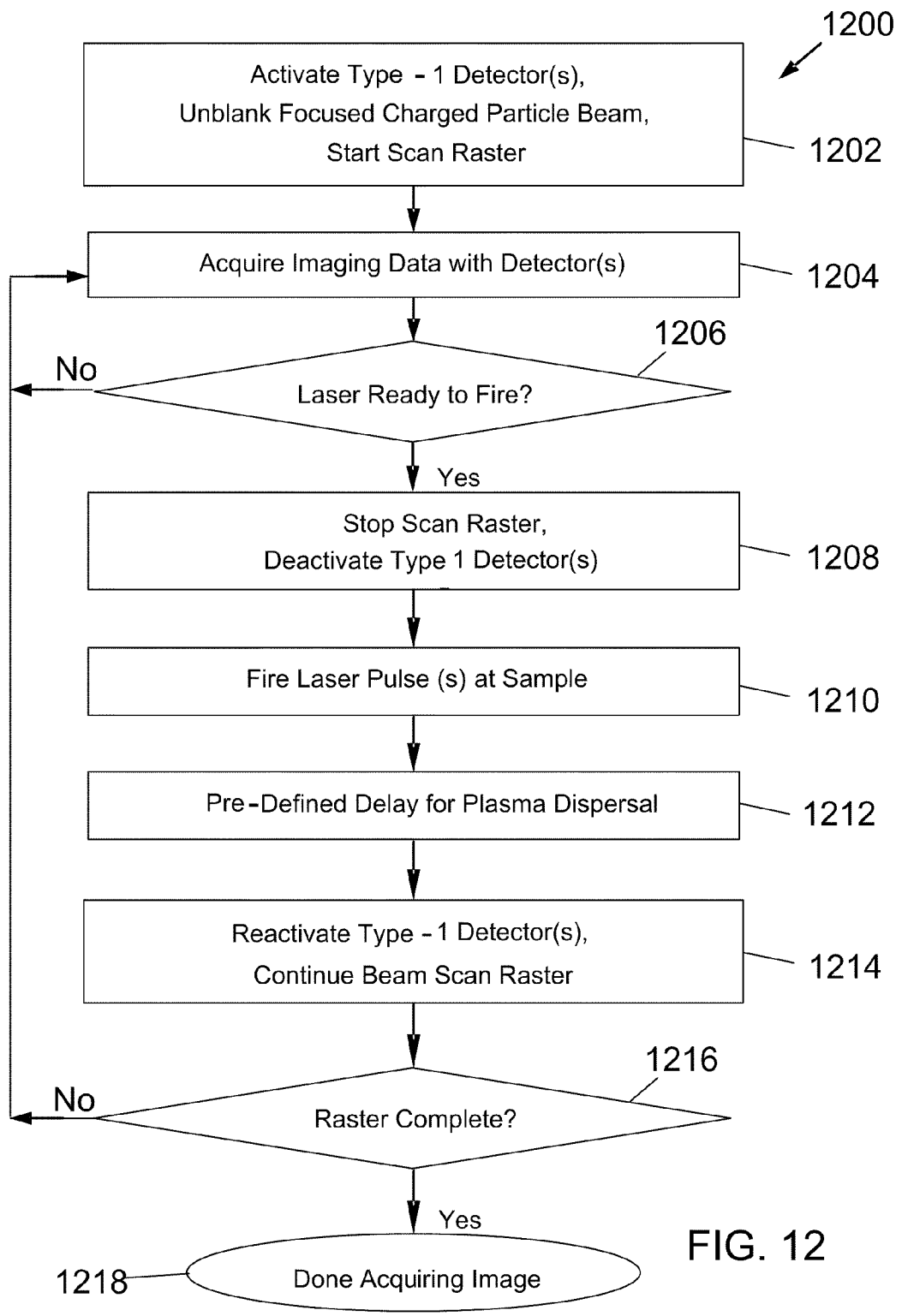
FIG. 12 shows a flow chart for operation of the preferred embodiment in FIG. 11.

FIG. 12 shows a flow chart 1200 for operation of the preferred embodiment in FIG. 11, comprising a plurality of type-1 detectors (for clarity, the details of how the detectors are activated and deactivated are not shown). In block 1202, a new imaging and laser processing process begins with the activation of one or more of the type-1 detectors, the unblanking of the beam, and the initiation of a scan raster. As the beam moves (typically in a raster pattern) across the sample surface in block 1204, secondary and/or backscattered particles are emitted from the surface and collected by the type-1 detector(s) to provide imaging signal(s), such as secondary electron (SE) and/or backscattered electron (BSE) signals during SEM operation, or secondary ion (SI) signals during FIB operation. Decision block 1206 monitors the status of the laser, such as laser 1106 in FIG. 11, to determine whether the laser is ready to fire. Typical pulsed lasers have a minimum time to recover after each laser pulse; this recovery time determines the maximum laser repetition rate. Once the laser has recovered from the previous pulse, it is ready to fire again. In some cases, the maximum firing rate may be desired, in which case, once the laser is ready, the system (such as system 1100 in FIG. 1) would transition to block 1208 with minimal delay. In other cases, further imaging may be desired prior to firing the next laser pulse, in which case the system would remain in block 1204 for some additional period after the laser was ready to fire again before transitioning to block 1208. Once the laser is ready to fire, and the operator or system wants to fire the laser, the scan raster is stopped and the type-1 detector(s) are deactivated. Until both of these conditions are met, however, the system will continue in block 1204 acquiring image data using one or more type-1 detectors. The charged particle beam may be (optionally) blanked at this point.

Once the type-1 detectors have been protected from the potentially deleterious effects of the plasma plume (such as plume 1126 in FIG. 11) by deactivation, one or more successive laser beam pulses can be fired at the sample in block 1210. For the embodiment in FIG. 11, in block 1212 a predetermined delay period, preferably 0.1 to 10 µs, will expire before proceeding to block 1214. This delay period allows for dispersal or dissipation of the plasma plume away from the sample, thereby protecting the type-1 detectors as described above. As used herein, dispersal or dissipation of the plume will be used to refer to dispersal or dissipation to the point that the type-1 detectors will no longer be saturated and/or damaged by the particle in the plume, even though some of the particles generated by the laser beam milling may still be present. After the delay period, in block 1214, the system is restored to the imaging mode by reactivating the type-1 detectors and continuing the scan raster from the X-Y location where the raster was stopped in block 1208. Decision block 1216 monitors progress towards completion of the scan raster, returning to block 1204 if the raster is incomplete, and exiting to block 1218 if is complete. In preferred embodiments, the entire process of deactivating the detector, directing the laser pulses at the sample, waiting for the plume to dissipate, and reactivating the detector will take only a few microseconds, for example less than 100 μs. In fact, to an operator viewing images of the sample as laser milling is taking place, the milling and imaging with the charged particle beam will preferably appear to be simultaneous.

Figure 13:
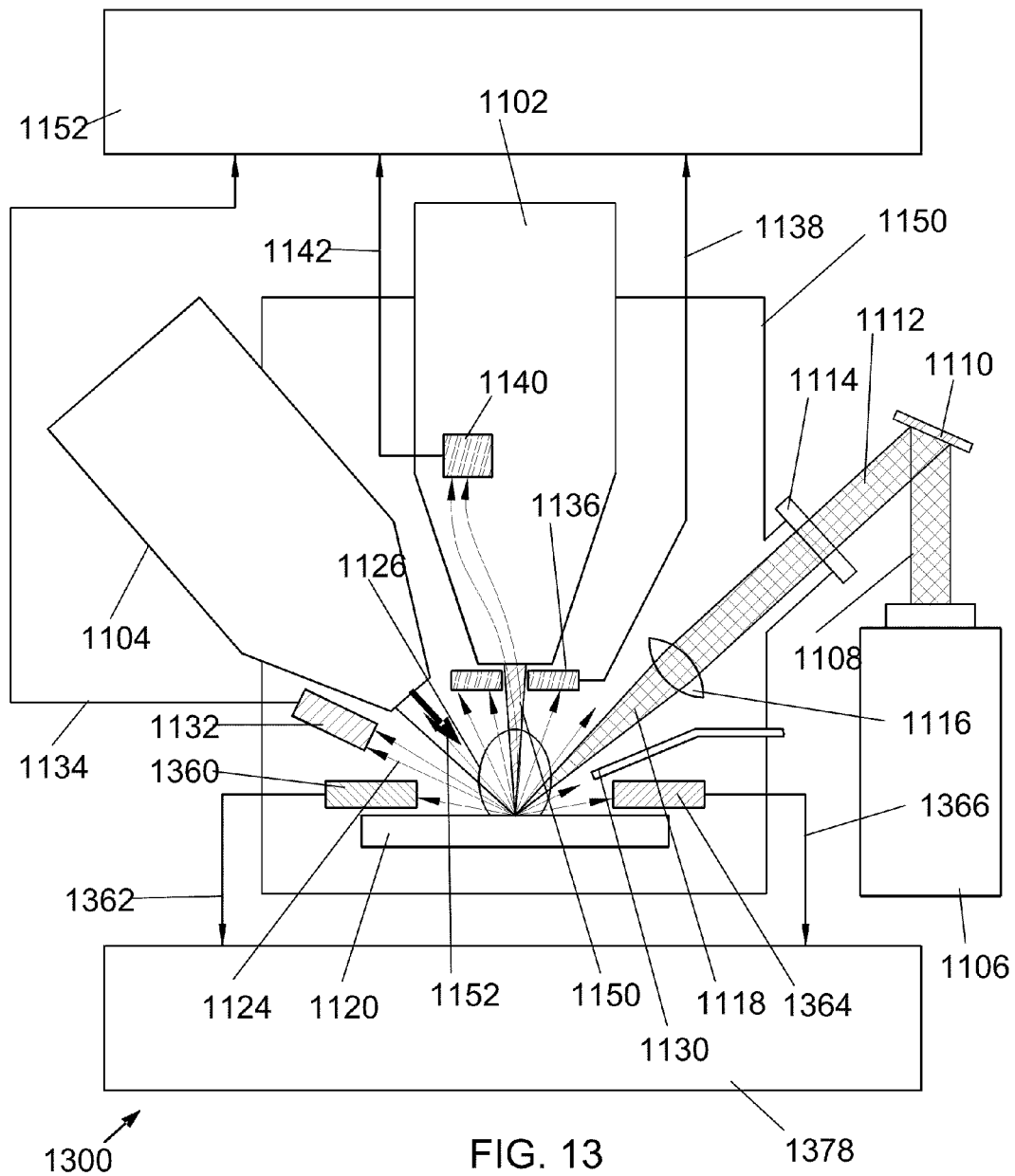
FIG. 13 shows a system according to a preferred embodiment of the present invention that combines a laser for rapid material removal with a FIB for further material processing and a SEM for monitoring the material removal process, with pluralities of type-1 and type-2 detectors.

FIG. 13 shows a system 1300 according to a preferred embodiment of the present invention that is configured as in FIG. 11, but with the addition of a plurality of "type-2" detectors 1360 and 1364, connected by cables 1362 and 1366, respectively, to a type-2 detector controller 1378. A type-2 detector is capable of collecting electrons and ions from the plasma plume 1126 without risk of saturation and/or damage (see FIG. 20). Typical type-2 detectors may comprise Faraday cups, or other types of detectors with much lower gains (typically 1× to 100×) than the type-1 detectors. In one preferred embodiment, a first type-2 detector 1360 may be mounted close to the focus of laser beam 1118 in order to subtend a large enough solid angle at the sample to collect an appreciable fraction of electrons and negative ions out of the plume 1126 (with a positive bias relative to the sample). Mounting and positioning of such detectors is known in the prior art, and a person of skill in the art will recognize that an appreciable fraction of electrons and negative ions out of the plume would be a large enough fraction to allow the plume to be accurately characterized.

A second type-2 detector 1364 may be mounted away from detector 1360 and biased negatively to collect an appreciable fraction of positive ions out of the plume 1126. Type-2 detectors may enable endpoint detection for the laser ablation process, as described below.

During imaging, it is preferable that the type-2 detectors not collect secondary electrons or ions, or backscattered electrons, since this would decrease the high signal-to-noise ratio for imaging. Thus, in the absence of the plume 1126, it is preferable that the type-2 detectors be deactivated while the type-1 detectors are activated. Conversely, just before a laser pulse and during the period after the laser pulse, while there is still a plasma plume above the sample, it is desirable to deactivate the type-1 detectors, as discussed above with reference to FIGS. 11-12. Activating the type-2 detectors to collect a signal from the plasma plume may provide several types of information:

1) a signal indicating the presence of a plasma plume above the sample, and thus a condition during which it is undesirable to activate the type-1 detectors to protect the type-1 detectors from saturation and/or damage;
2) A signal indicating that the plasma plume has dissipated to a level allowing reactivation of the type-1 detectors and continuation of sample imaging;
3) An endpointing signal, allowing the operator or system to determine when the laser ablation process has milled down to a predetermined endpoint, such as an underlying layer of material, etc.

Endpointing processes for use with laser machining are described in U.S. Pat. App. No. 61/079,304 for "Method and Apparatus for Laser Machining" (Jul. 9, 2009), which is assigned to the assignee of the present invention and hereby incorporated by reference. One type of endpoint signal may be a photoelectron yield spectroscopic (PYS) signal for analysis of the sample during processing. In PYS, the laser beam induces the emission of photoelectrons which may be collected by one or more of the type-2 detectors to provide information on the number of electrons and ions produced per laser pulse. This number is indicative of the material currently being ablated by the laser and thus may serve as an endpointing signal and/or analytical tool.

Type-2 detectors may be activated by the application of bias voltages to collect electrons or ions out of the plasma plume, as discussed below with reference to FIG. 20. Type-2 detector deactivation may be accomplished through removal of these collection bias voltages, as discussed below with reference to FIG. 20.

Figure 14:
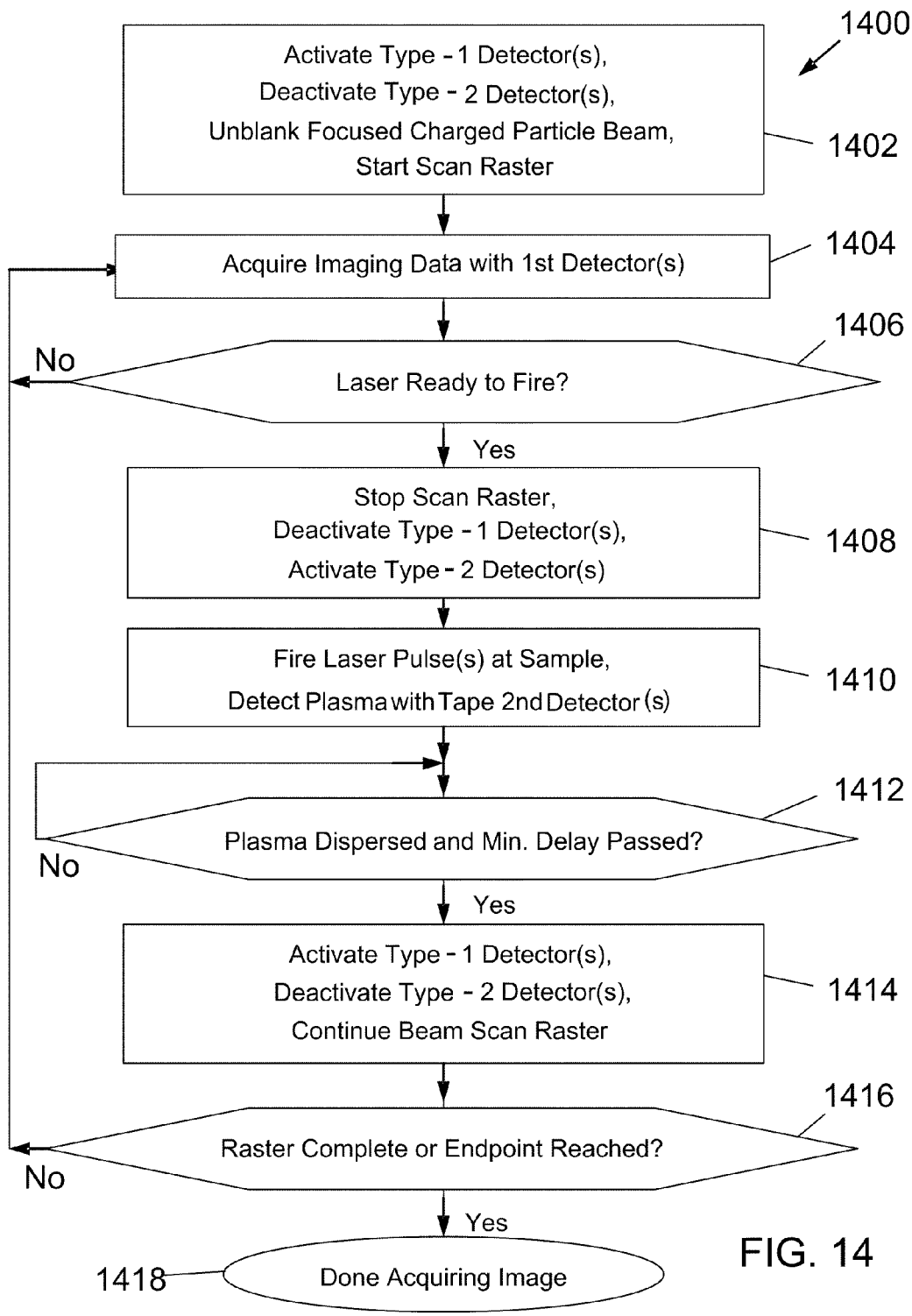
FIG. 14 shows a flow chart for operation of the preferred embodiment in FIG. 13.

FIG. 14 shows a flow chart 1400 for operation of the preferred embodiment of FIG. 13, comprising pluralities of both type-1 and type-2 detectors (for clarity, the details of how individual type-1 and type-2 detectors are activated and deactivated are not shown). In block 1402, a new imaging and laser processing process begins with the activation of one or more of the type-1 detectors, the deactivation of the type-2 detectors, the unblanking of the beam, and the initiation of a scan raster. As the beam moves (typically in a raster pattern) across the sample surface in block 1404, secondary and/or backscattered particles are emitted from the surface and collected by the type-1 detector(s) to provide imaging signal(s), such as secondary electron (SE) and/or backscattered electron (BSE) signals during SEM operation, or secondary ion (SI) signals during FIB operation. Decision block 1406 monitors the status of the laser to determine whether the laser is ready to fire. Once the laser is ready to fire, and the operator or system wants to fire the laser, block 1408 is entered. Until both conditions are met, the system can continue in block 1404 acquiring image data using one or more type-1 detectors.

In block 1408, the scan raster is stopped, the type-1 detector(s) are deactivated, and one or more of the type-2 detectors may be activated. The charged particle beam may be (optionally) blanked at this point. Once the type-1 detectors have been protected from the potentially deleterious effects of the plasma plume by deactivation, one or more successive laser beam pulses can be fired at the sample in block 1410. For the embodiment in FIG. 13, in block 1412 a predetermined delay period, preferably 0.1 to 10 μs, will expire before the system continues. In addition, the system also monitors the output(s) of the type-2 detectors to detect whether the plasma plume has dispersed.

In a preferred embodiment, only when both (1) the minimum predetermined delay period has occurred since the laser pulse was fired, and (2) a plasma is not detected by the type-2 detectors will the system continue to block 1414. The minimum delay period can be used as a back-up protection for the type-1 detectors in the event that the type-2 detectors give an erroneous signal that the plasma has dispersed. Once both of these conditions have been met, in block 1414, the system is restored to the imaging mode by reactivating one or more of the type-1 detectors, deactivating the type-2 detectors, and continuing the scan raster from the X-Y location where the raster was stopped in block 1408. Decision block 1416 monitors progress towards completion of the scan raster, returning to block 1404 if the raster is incomplete, and exiting to block 1418 if is complete. As with the method described above, in preferred embodiments, the entire process of deactivating the type-1 detector, activating the type-2 detector, directing the laser pulses at the sample, waiting for the plume to dissipate, deactivating the type-2 detector, and reactivating the type-1 detector will take only a few microseconds, for example less than 100 μs. In fact, to an operator viewing images of the sample as laser milling is taking place, the milling and imaging with the charged particle beam will preferably appear to be simultaneous.

Figure 15:
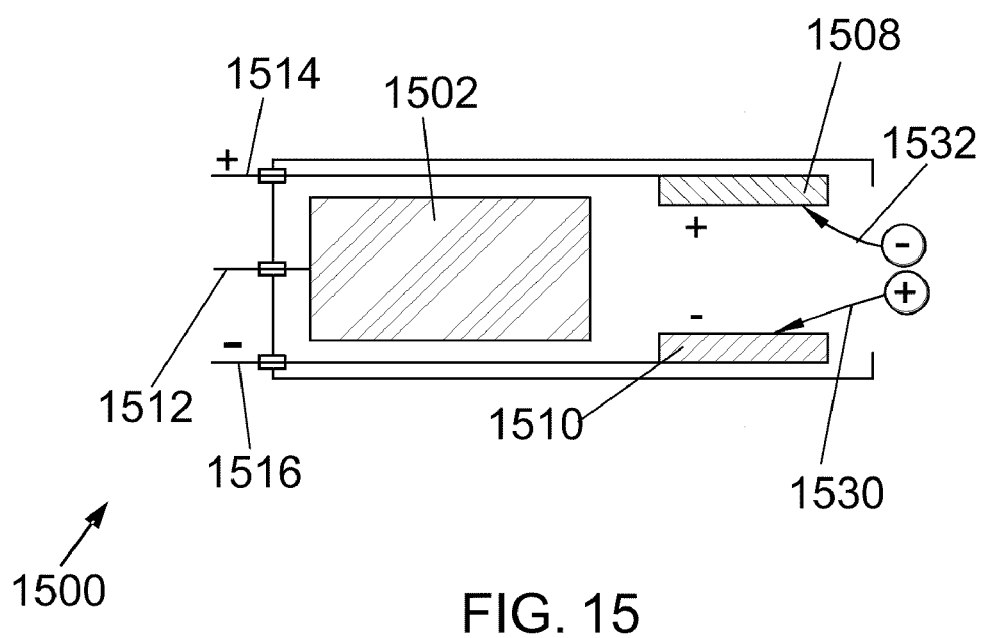
FIG. 15 illustrates the operation of detector deactivating plates in a preferred embodiment of an off-axis type-1 detector.

FIG. 15 illustrates a preferred embodiment of a detector assembly 1500 including detector deactivating plates 1508 and 1510 in a preferred embodiment of an off-axis type-1 detector (such as detectors 1132 in FIGS. 11 and 13). Detector assembly 1500 comprises a detector 1502 positioned behind the detector deactivating plates 1508 and 1510, connected by cables 1514 and 1516, respectively, to a type-1 detector controller 1152 (shown in FIGS. 11 and 13). Detector 1502 is connected to the type-1 controller by a cable 1512. Plates 1508 and 1510 within detector assembly 1504 can be either flat or can comprise circular arcs with positive and negative bias voltages applied as shown.

Detector plates 1508 and 1510 may perform the type-1 detector deactivation function by substantially reducing or preventing transmission of both electrons and ions to detector 1502 as illustrated by electron (or negative ion) trajectory 1532 and ion trajectory 1530. The negative voltage on plate 1510 collects the positive ions from the plasma plume, such as plume 1126 in FIGS. 11 and 13. The positive voltage on plate 1508 collects the electrons and negative ions from the plasma plume. As a result, only the neutral particles from the plasma plume may strike the detector 1502. This neutral flux may be reduced or substantially eliminated by configuring the entrance to detector 1502 to not be in line-of-sight to the plasma plume. To activate the off-axis type-1 detector, the voltages on plates 1508 and 1510 would be set substantially equal to the voltage on the entrance to detector 1502.

FIG. 16 illustrates 1600 the operation of detector deactivating grids 1608 and 1610 in another embodiment of an off-axis type-1 detector (such as detectors 1132 in FIGS. 11 and 13). Detector assembly 1604 comprises a detector 1602 positioned behind the detector deactivating grids 1608 and 1610, connected by cables 1614 and 1616, respectively, to a type-1 detector controller 1152 (shown in FIGS. 11 and 13). Detector 1602 is connected to the type-1 controller by a cable 1612.

In FIG. 16A, a schematic graph 1660 of the voltage along the axis of detector assembly 1604 illustrates how the combined positive voltage on grid 1608 and the negative voltage on grid 1610 prevents the transmission of both positive ions (trajectory 1630) and both electrons and negative ions (trajectory 1632). The electrons and negative ions are shown reversing direction before passing through grid 1610, and a portion of these negatively-charged particles may strike the positively-biased grid 1608. Any secondary or backscattered particles emitted from grid 1608 will not be able to reach the entrance to detector 1602 due to the negative bias on grid 1610. Only the neutral particles from the plasma plume may strike the detector 1602. As with the detector assembly of FIG. 15, this neutral flux may be reduced or substantially eliminated by configuring the entrance to detector 1602 to not be in line-of-sight to the plasma plume. To activate the off-axis type-1 detector 1604, the voltages on both grids 1608 and 1610 would be set substantially equal to the voltage on the entrance to detector 1602.

In FIG. 16B, an end view looking into the detector 1604 is shown. Only the first grid 1608 will be visible through the entrance opening 1606.

FIG. 17 illustrates the operation of detector deactivating plates 1708 and 1710 in a preferred embodiment of a type-1 detector located below the bottom of a charged particle column (such as detectors 1136 in FIGS. 11 and 13). The type-1 detector assembly 1700 comprises a pair of multichannel plates (MCPs) 1704 and 1706 (in a typical dual-chevron configuration) positioned above the detector deactivating plates 1708 and 1710, which are connected by cables 1714 and 1716, respectively, to a type-1 detector controller 1152 (shown in FIGS. 11 and 13). MCPs 1704 and 1706 are connected to the type-1 controller by cables 1712 and 1713, respectively. Above MCP 1704, the lower end 1702 of a charged particle column is shown. An additional significant benefit of this preferred embodiment of the present invention may be the substantial reduction of the deposition of contaminants from the plasma plume on the bottom of the column and also up inside the column. This type of contamination sometimes forms resistive deposits which can charge up and deflect the charged particle beam.

The type-1 detector deactivation function of substantially reducing or preventing transmission from sample 1780 of both electrons and ions to MCP 1706 is illustrated by electron trajectory 1732 and ion trajectory 1730. The negative voltage on plate 1710 collects the positive ions from the plasma plume, such as plume 1126 in FIGS. 11 and 13. The positive voltage on plate 1708 collects the electrons and negative ions from the plasma plume. Only the neutral particles from the plasma plume may strike the MCP 1706. To activate the off-axis type-1 detector 1704, the voltages on both plates 1708 and 1710 would be set substantially equal to the voltage on the entrance to detector 1706.

FIG. 18 illustrates the operation of detector deactivating grids 1808 and 1810 in another preferred embodiment of a type-1 detector located below a charged particle column, such as detectors 1136 in FIGS. 11 and 13. The type-1 detector assembly 1800 comprises a pair of multichannel plates (MCPs) 1804 and 1806 (in a typical dual-chevron configuration) positioned above the deactivating grids 1808 and 1810, which are connected by cables 1814 and 1816, respectively, to a type-1 detector controller (not shown) such as controller 1152 in FIGS. 11 and 13. MCPs 1804 and 1806 are connected to the type-1 controller by cables 1812 and 1813, respectively. Above MCP 1804, the lower end 1802 of a charged particle column is shown. As in FIG. 17, an additional significant benefit of this preferred embodiment of the present invention may be the substantial reduction of the deposition of contaminants from the plasma plume on the bottom of the column and also up inside the column.

FIG. 18A shows a schematic graph 1860 of the voltage along the axis of the type-1 detector assembly, which illustrates how the combined positive voltage on grid 1808 and the negative voltage on grid 1810 prevents the transmission from sample 1880 of both positive ions (trajectory 1830 in FIG. 18) and both electrons and negative ions (trajectory 1832 in FIG. 18). The electrons and negative ions are shown reversing direction before passing through grid 1810. A portion of these negatively-charged particles may strike the positively-biased grid 1808. Any secondary or backscattered particles emitted from grid 1808 will not be able to reach the entrance to MCP 1806 due to the negative bias on grid 1810. Only the neutral particles from the plasma plume may strike the MCP 1806. To activate the off-axis type-1 detector, the voltages on both grids 1808 and 1810 would be set substantially equal to the voltage on the entrance to MCP 1806.

Type-1 detectors located within charged particle columns, such as detectors 1140 in FIGS. 11 and 13 may utilize one or more pre-existing electrodes within the charged particle column (between the lower end of the column and the detector 1140) to deflect electrons and ions away from the in-column type-1 detector entrance. FIGS. 15-18 illustrate exemplary preferred embodiments of type-1 detectors, however, other structures and methods for deactivating and activating type-1 detectors are also within the scope of the present invention.

Figure 19:
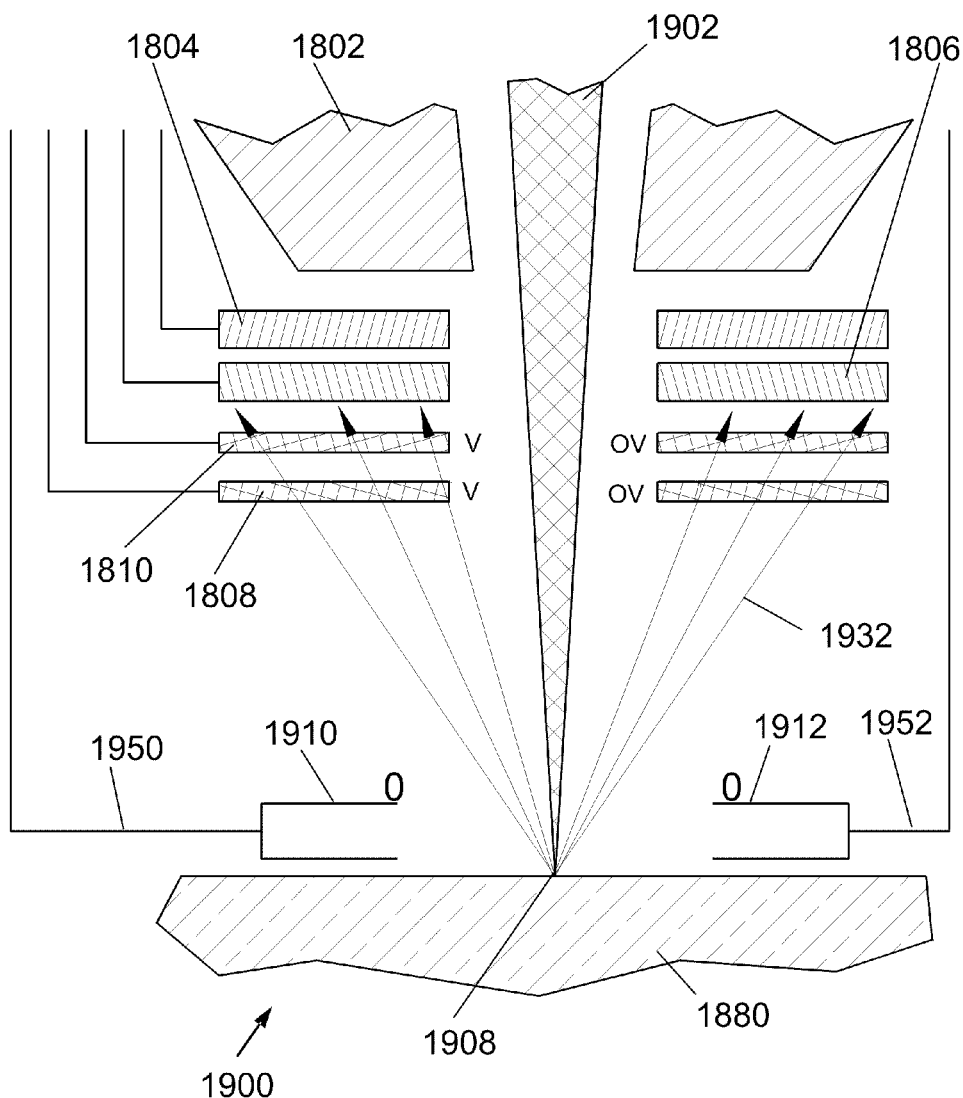
FIG. 19 illustrates the activation of type-1 detectors and the deactivation of type-2 detectors during imaging.

FIG. 19 illustrates 1900 the activation of a type-1 detector (located below the bottom of the column) and the deactivation of type-2 detectors during imaging. The type-1 detector from FIG. 18 is shown here along with two type-2 detectors 1910 and 1912, connected by cables 1950 and 1952, respectively, to a type-2 detector controller 1378 (shown in FIG. 13). During imaging, as described in block 1402 of FIG. 14, the type-2 detectors are deactivated by applying 0 V to the detector collection ends as shown in FIG. 19. Thus, there are no electric fields present between the sample 1880 and type-2 detectors 1910 and 1912 to attract either electrons or ions into the type-2 detectors. Since secondary and backscattered particles typically emerge traveling upwards from location 1908 where the primary charged particle beam 1902 strikes the sample 1880, only a small fraction of secondary and backscattered particles will be collected by detectors 1910 and 1912. A much larger fraction of secondary- and/or backscattered-particles 1932 will pass through grids 1808 and 1810 to be collected by MCP 1806.

Figure 20:
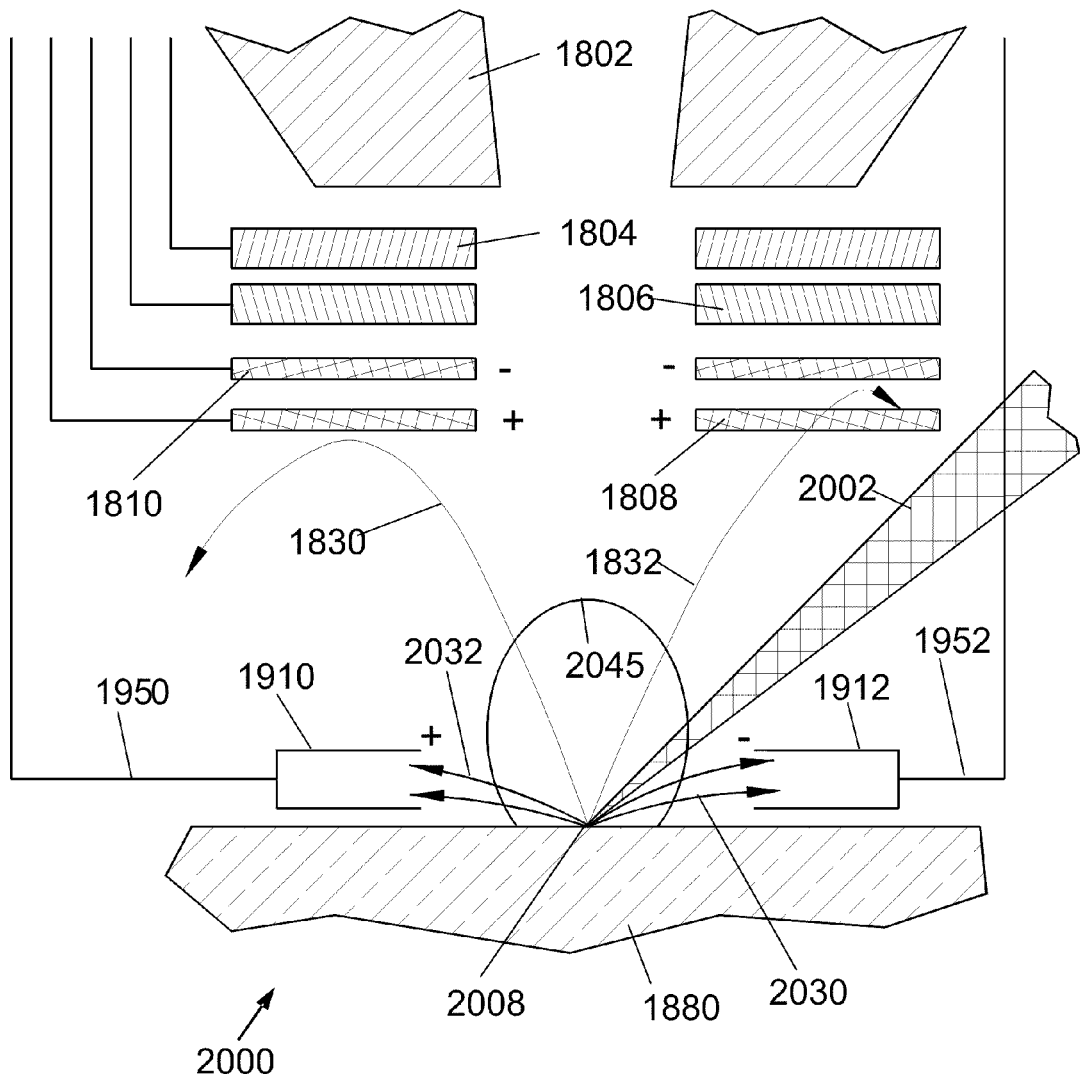
FIG. 20 illustrates the deactivation of type-1 detectors and the activation of type-2 detectors during laser pulsing and the dissipation of a plasma plume.

FIG. 20 illustrates 2000 the column configuration in FIG. 19, showing deactivation of a type-1 detector and activation of type-2 detectors during laser pulsing 2002 and during the dissipation of a plasma plume 2045. The detector deactivating grids 1808 and 1810 are biased as in FIG. 18 to protect the type-1 detector (comprising multi-channel plates 1806 and 1804) against the large flux of electrons and negative ions 1832 and positive ions 1830 which may be produced by laser beam 2002 striking the surface of sample 1880 at location 2008. The deactivating function of grids 1808 and 1810 is as illustrated in FIG. 18. A positive bias is applied to the collection end of type-2 detector 1910 to attract electrons and negative ions 2032 from the plasma plume 2045. A negative bias is applied to the collection end of type-2 detector 1912 to attract positive ions 2030 from the plasma plume 2045. The voltage difference between detectors 1910 and 1912 creates an electric field parallel to the surface of sample 1880 which serves to "sweep away" the plasma plume 2045 in a shorter time than would be the case in the absence of the type-2 detectors (e.g., the configuration in FIG. 11), thus the addition of type-2 detectors has the additional benefit of improving throughput by reducing the time required for protecting the type-1 detectors (e.g., blocks 1412 and 1414 in FIG. 14). Another benefit of the type-2 detectors is to protect structures within the system such as the type-1 detectors and the lens for focusing the laser beam (such as lens 306 in FIGS. 3A-4B) from possible damage stemming from the plasma plume. The portion of the plasma plume that is collected by the positively- and negatively-biased type-2 detectors is not able to reach, and possibly damage, these detectors and structures.

Figure 21:
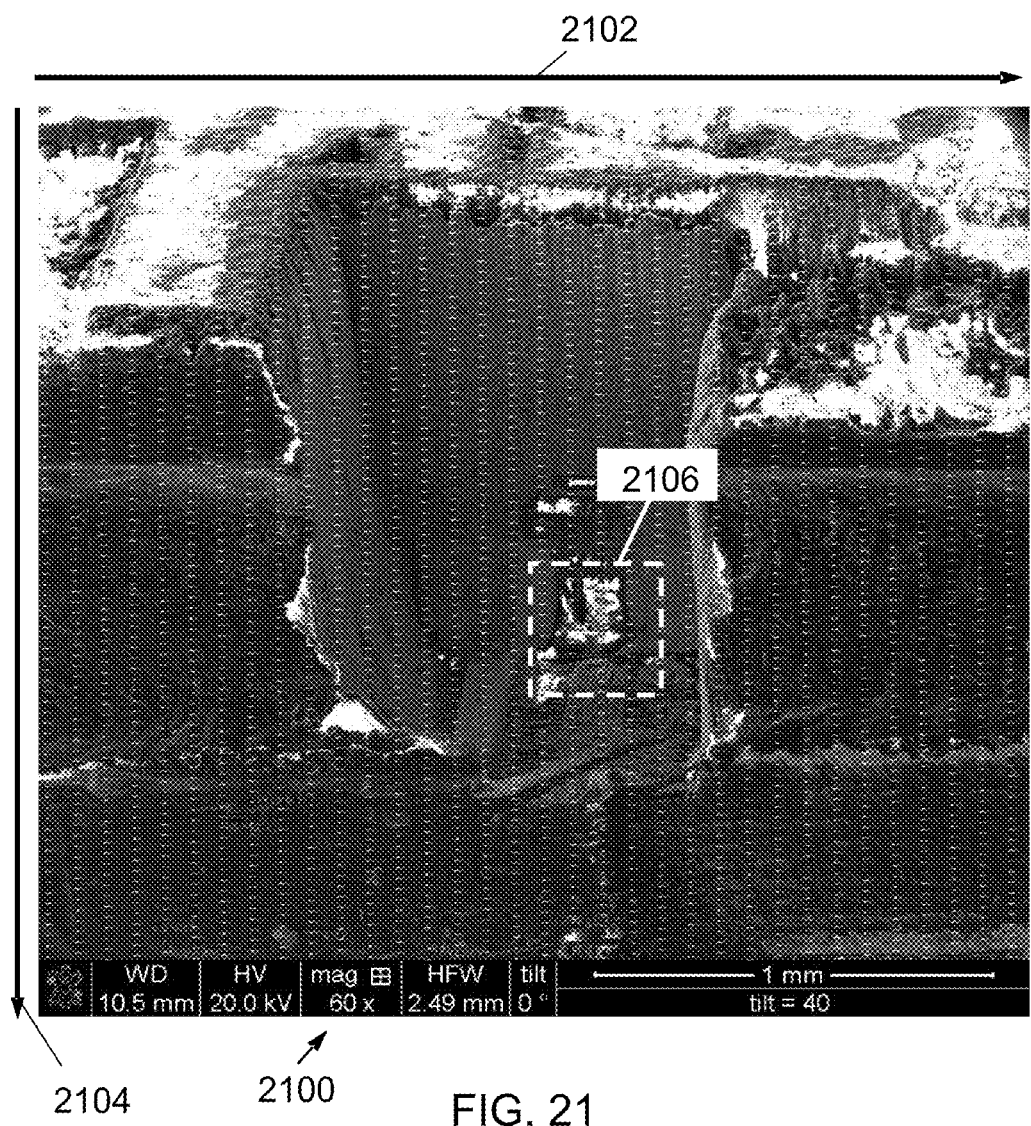
FIG. 21 shows an image from a type-1 detector in a prior art system showing interference between laser ablation of a sample and imaging of the sample.
Figure 25:
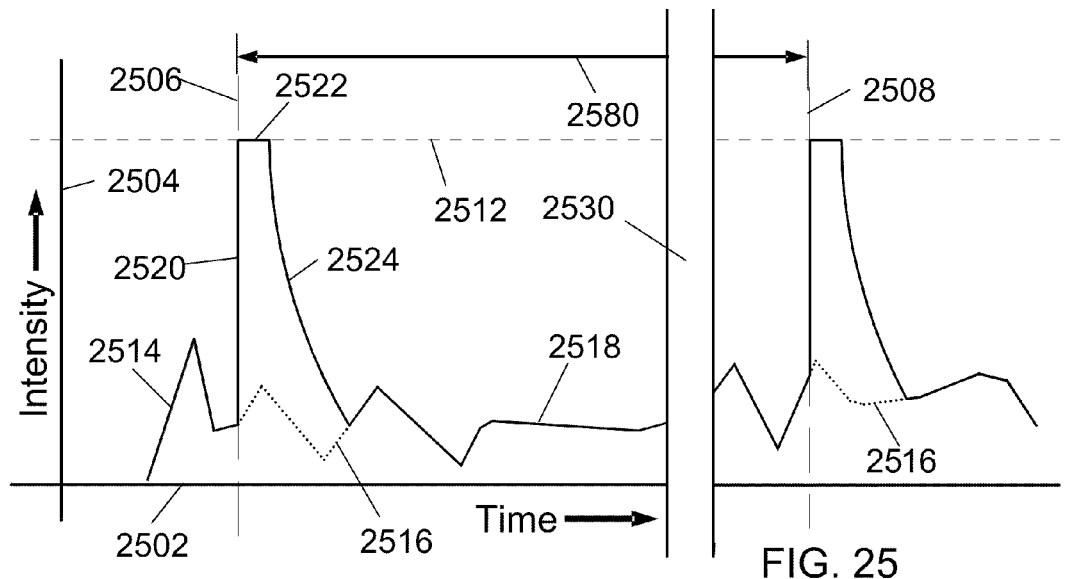
FIG. 25 is a schematic graph of the effects of detector saturation for the preferred embodiment illustrated in FIGS. 21-22.

FIG. 21 shows an image 2100 from a type-1 detector illustrating interference between laser ablation of a sample and imaging of the sample. A small region, dashed white square 2106, in the center of image 2100 is shown in close-up in FIG. 22. The beam scans to the right along the X-axis 2102, thus the white streaks arising from saturation of the detector are horizontal with the brightest pixels at the left (during the laser pulse) and decaying to the right (as the plasma plume dissipates). The Y-axis (vertical downwards) 2104 is the slow-scan direction of the raster. In this example, the type-1 detector is not deactivated either during the laser pulses or while the plasma plume dissipates, so electrons and ions from the plasma plumes induced by each laser pulse saturate the detector. As the beam scans horizontally towards the right along each scan line, charged particles from the plasma plume are collected by the detector, causing white pixels (maximum intensity) starting at 2206 and extending to the right with a gradual decay extending past point 2208. In between laser pulses the type-1 detector recovers and can provide a high signal-to-noise image. FIG. 25, below, is a schematic graph of the image intensity before, during, and after two laser pulses.

Figure 22:
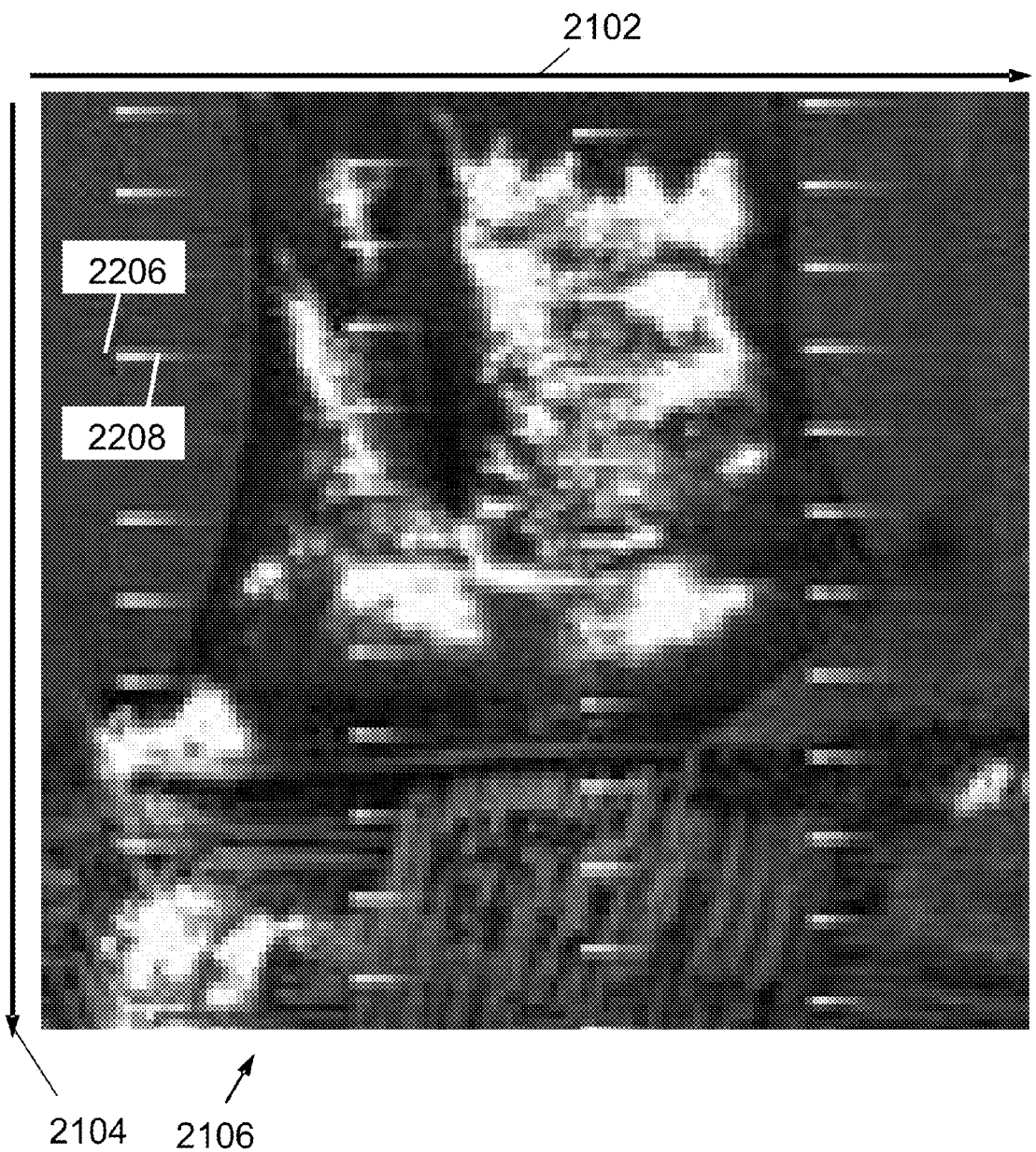
FIG. 22 shows a close-up image of the center of FIG. 21.
Figure 23:
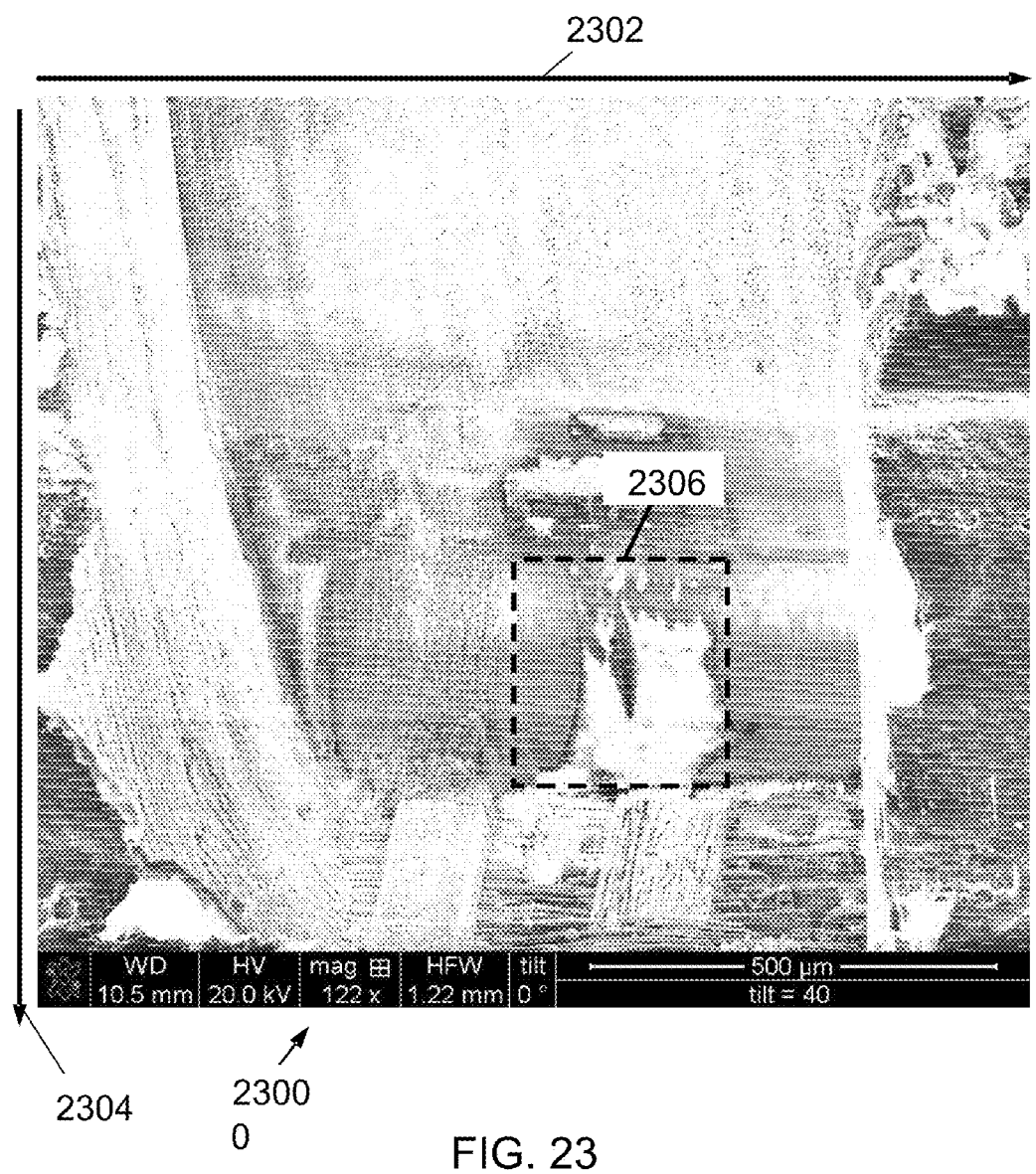
FIG. 23 shows an image from a type-1 detector in a prior art system showing interference between laser ablation of a sample and imaging of the sample with a higher laser fluence than in FIGS. 21-22.
Figure 26:
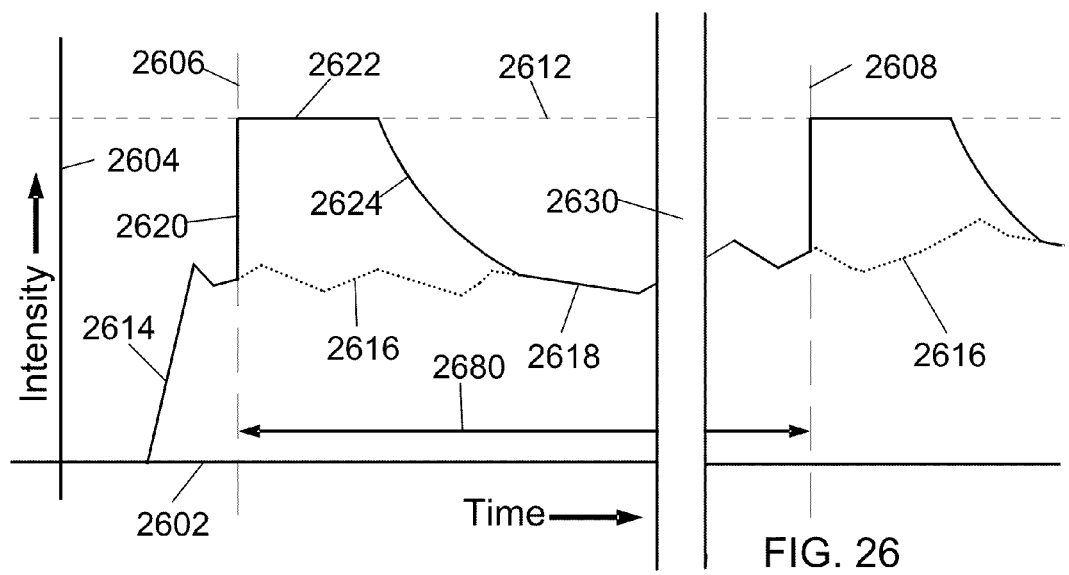
FIG. 26 is a schematic graph of the effects of detector saturation for the example illustrated in FIGS. 23-24.

FIG. 23 shows an image 2300 from a type-1 detector illustrating interference between laser ablation of a sample and imaging of the sample for a higher laser beam intensity than the previous example in FIGS. 21-22. A small region, dashed square 2306, in the center of image 2300 is shown in close-up in FIG. 24. The beam scans to the right along the X-axis 2302, thus the white streaks arising from saturation of the detector are horizontal with the brightest pixels at the left (during the laser pulse) and decaying to the right (as the plasma plume dissipates). The Y-axis (vertical downwards) 2304 is the slow-scan direction of the raster. In this example, the type-1 detector is not deactivated either during the laser pulses or while the plasma plume dissipates, so electrons and ions from the plasma plumes induced by each laser pulse saturate the detector—because of the higher laser intensity here compared with the example in FIGS. 21-22, the degree of detector saturation is much greater, resulting in longer recovery times for the type-1 detector after each laser pulse (see also FIG. 24). The white pixels (maximum intensity) start at 2406 and extend far to the right with a very gradual decay extending past point 2408. Unlike the situation in FIGS. 21-22, between laser pulses the type-1 detector cannot fully recover, thus the entire image is brighter than for FIGS. 21-22. FIG. 26, below, is a schematic graph of the image intensity before, during, and after two laser pulses.

FIG. 25 is a schematic graph of the effects of detector saturation without type-1 detector deactivation for the case illustrated in FIGS. 21-22. The image intensity (on Y-axis 2504) is plotted as a function of time (on X-axis 2502). The X-axis is shown with a break 2530 in the data to allow the image saturation at laser pulses 2506 and 2508 to be shown on the same graph at the desired scale. The image intensity 2514 before the first laser pulse at time 2506 is unsaturated. The dashed portion of the intensity curve 2516 represents the correct image intensity, i.e., the intensity that would be displayed using various embodiments of the present invention which enable type-1 detector deactivation during laser pulses and while the plasma plumes dissipate. Due to the lack of detector deactivation, however, what is actually displayed to the system operator is an incorrect intensity curve comprising a rapid rise 2520, followed by a plurality of saturated pixels 2522 (all showing the maximum intensity 2512), followed by a gradual intensity decrease 2524 which eventually reaches the unsaturated image intensity curve 2518. The intensity curve would then be correctly determined by the detector until the next laser pulse at time 2508. The time interval 2580 between laser pulses may typically be 0.5 to 2.0 ms.

Figure 24:
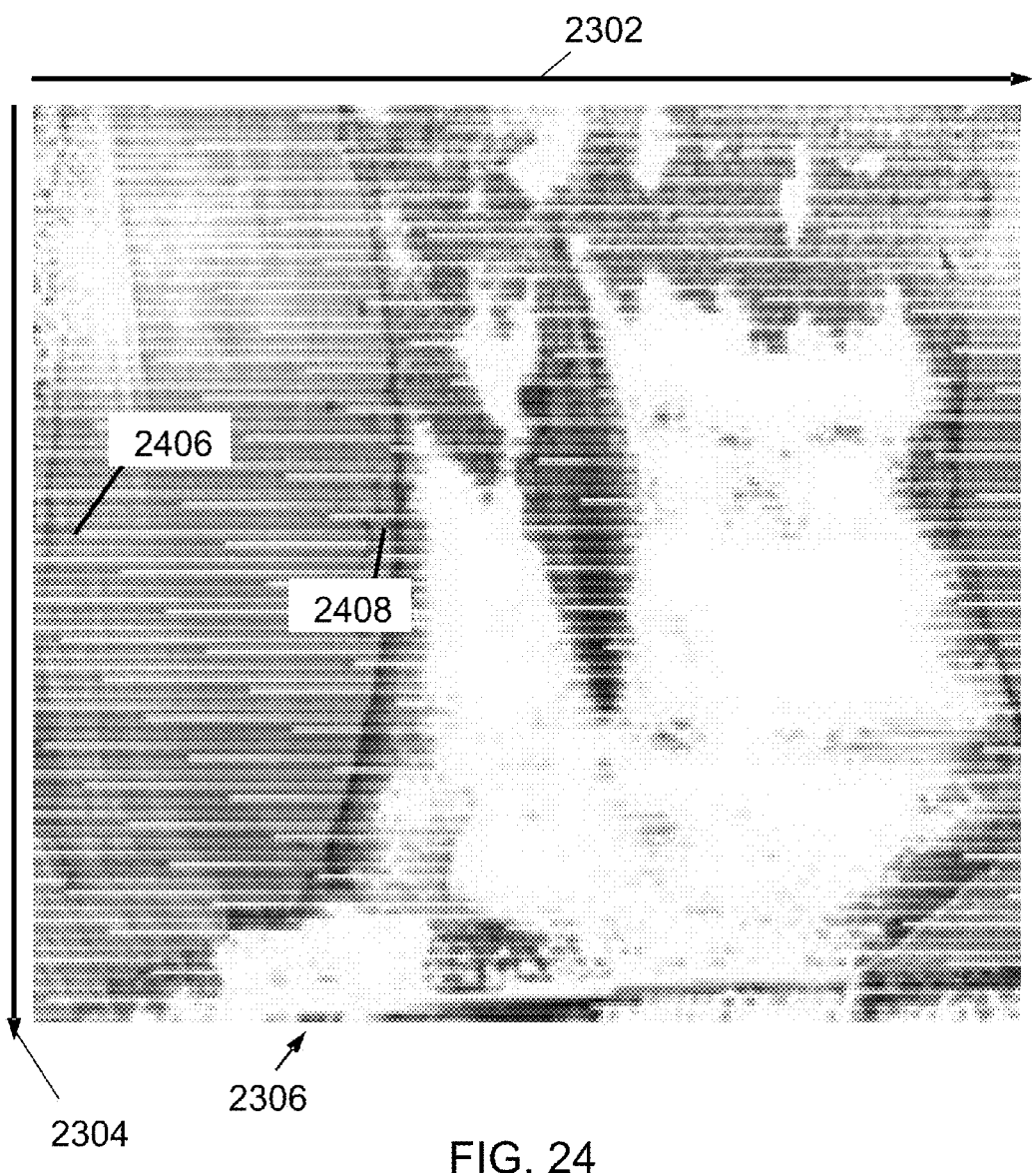
FIG. 24 shows a close-up image of the center of FIG. 23.

FIG. 26 is a schematic graph of the effects of detector saturation without type-1 detector deactivation for the case illustrated in FIGS. 23-24. The image intensity (on Y-axis 2604) is plotted as a function of time (on X-axis 2602). The X-axis is shown with a break 2630 in the data to allow the image saturation at laser pulses 2606 and 2608 to be shown on the same graph at the desired scale. The image intensity 2614 before the first laser pulse at time 2606 is unsaturated. The dashed portion of the intensity curve 2616 represents the correct image intensity, i.e., the intensity that would be displayed using various embodiments of the present invention which enable type-1 detector deactivation during laser pulses and while the plasma plumes dissipate. Due to the lack of detector deactivation, however, what is actually displayed to the system operator is an incorrect intensity curve comprising a rapid rise 2620, followed by a plurality of saturated pixels 2622 (all showing the maximum intensity 2612). FIG. 26 shows a substantially longer period of saturation than is seen in FIG. 25 due to the increased laser pulse power. The curve showing the intensity decrease to the correct unsaturated levels is also longer and more gradual in FIG. 26 due to the greater degree of detector saturation. Curve 2624 eventually reaches the unsaturated image intensity curve 2618. The intensity curve would then be correctly determined by the detector until the next laser pulse at time 2608. Due to longer-term recovery effects within the detector, the image intensity for curve 2618 demonstrates some increase in the average detector signal level and a loss in contrast. The time interval 2680 between laser pulses may typically be 0.5 to 2.0 ms.

Figure 27:
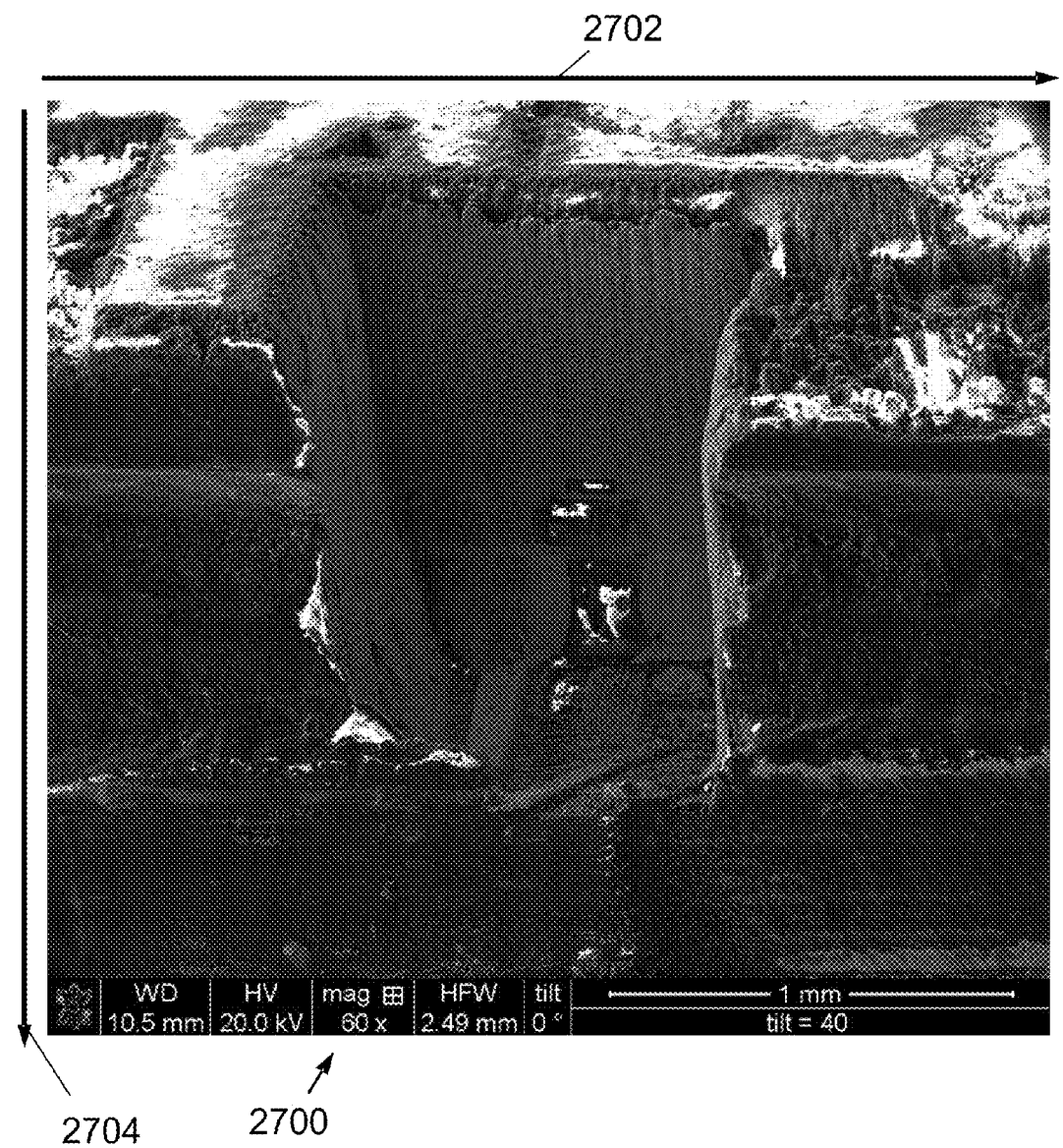
FIG. 27 shows a simulated image from a type-1 detector in a system according to preferred embodiments of the invention, showing no interference between laser ablation of a sample and imaging of the sample due to deactivation of type-1 detectors during laser ablation.

FIG. 27 shows an image 2700 from a type-1 detector in a system embodying deactivation of type-1 detectors, showing no interference between laser ablation of a sample and imaging of the sample. The fast-scan axis 2702 is horizontal to the right, and the slow-scan axis 2704 is vertical downwards. Either of the methods described in the flowcharts of FIG. 12 or 14 would allow the type-1 detector to be protected against saturation by deactivation over a period extending from just before each laser pulse until after the plasma plumes have dissipated.

The present invention has broad applicability and can provide many benefits as described and shown in the examples above. The embodiments will vary greatly depending upon the specific application, and not every embodiment will provide all of the benefits and meet all of the objectives that are achievable by the invention. Although much of the previous description is directed at processing semiconductor devices or wafers, the invention could be applied to any suitable substrate or surface. Particle beam systems suitable for carrying out the present invention are commercially available, for example, from FEI Company, the assignee of the present application. Type-2 detectors may comprise secondary ion mass spectrometers (SIMS) to provide more precise endpointing signals during laser processing. Although the drawings show the laser outside the vacuum system, system configurations having the laser within the vacuum system are also within the scope of preferred embodiments of the invention.

Although the description of the present invention above is mainly directed at an apparatus combining a laser with a charged particle beam system, it should be recognized that methods of using such an apparatus would also be within the scope of the present invention. Further, it should be recognized that embodiments of the present invention can be implemented via computer hardware, a combination of both hardware and software, or by computer instructions stored in a non-transitory computer-readable memory. The methods can be implemented in computer programs using standard programming techniques—including a non-transitory computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

Preferred embodiments of the present invention also make use of a particle beam apparatus, such as a FIB or SEM, in order to image a sample using a beam of particles. Such particles used to image a sample inherently interact with the sample resulting in some degree of physical transformation. Further, throughout the present specification, discussions utilizing terms such as "calculating," "determining," "measuring," "generating," "detecting," "forming," or the like, also refer to the action and processes of a computer system, or similar electronic device, that manipulates and transforms data represented as physical quantities within the computer system into other data similarly represented as physical quantities within the computer system or other information storage, transmission or display devices.

In the previous discussion and in the claims, the terms "including" and "comprising" are used in an open-ended fashion, and thus should be interpreted to mean "including, but not limited to . . . ." The terms "work piece," "sample," "substrate," and "specimen" are used interchangeably in this application unless otherwise indicated. The term "integrated circuit" refers to a set of electronic components and their interconnections (internal electrical circuit elements, collectively) that are patterned on the surface of a microchip. The term "semiconductor device" refers generically to an integrated circuit (IC), which may be integral to a semiconductor wafer, singulated from a wafer, or packaged for use on a circuit board. The term "FIB" or "focused ion beam" is used herein to refer to any collimated ion beam, including a beam focused by ion optics and shaped ion beams. Further, whenever the terms "automatic," "automated," or similar terms are used herein, those terms will be understood to include manual initiation of the automatic or automated process or step.

To the extent that any term is not specially defined in this specification, the intent is that the term is to be given its plain and ordinary meaning. The accompanying drawings are intended to aid in understanding the present invention and, unless otherwise indicated, are not drawn to scale.

Although the present invention and its advantages have been described in detail, it should be understood that various changes, substitutions, and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A charged-particle beam system, comprising:
   a vacuum chamber;
   a workpiece support for supporting a workpiece within the vacuum chamber;
   an ion beam system including an ion source for generating ions and a focusing column for forming the ions into a beam having a sub-micron diameter at the workpiece;
   an electron beam system including a source for generating electrons and a focusing column for forming the electrons into a beam having a sub-micron diameter at the workpiece; and
   a laser system for operating on the workpiece in the vacuum chamber, the laser system including a lens and generating a pulsed laser beam having an energy great enough to remove material from workpiece, the laser beam being focused onto the sample by a focusing element so that the laser beam and at least one of the charged particle beams are coincident on the sample.

2. The charged-particle beam system of claim 1 in which the laser beam is directed into the sample chamber without the use of optical fibers.

3. The charged-particle beam system of claim 1 in which the laser comprises an ultrashort-pulsed laser.

4. The charged-particle beam system of claim 1 further comprising:
   a first detector for detecting secondary particles emitted from the workpiece due to the impact of the charged particle beam; and
   a first detector controller configured to deactivate the first detector before the laser beam is focused onto the sample so that the first detector will not be saturated by particles generated by laser beam milling and to reactivate the first detector after the laser beam milling is complete and the particles generated by laser milling have dissipated.

5. The charged-particle beam system of claim 4 in which deactivating the first detector comprises applying a repelling bias voltage to a collection surface of the first detector, thereby preventing the collection of particles generated by laser beam milling.

6. The charged-particle beam system of claim 4 in which deactivating the first detector comprises turning off one or more internal voltages within the first detector, thereby reducing or eliminating the gain of the first detector.

7. The charged-particle beam system of claim 4 in which deactivating the first detector comprises applying a voltage to one or more deflection electrodes mounted between the workpiece and the first detector in order to prevent the transmission of particles to the first detector.

8. The charged-particle beam system of claim 4 in which activating the first detector comprises applying an attracting bias voltage to a collection surface of the first detector, thereby causing the particles emitted from the workpiece due to the impact of the charged particle beam to be attracted to the collection surface.

9. The charged-particle beam system of claim 4 in which the first detector comprises a detector positioned behind a pair of detector deactivating plates so that particles to be detected must pass between said detector deactivating plates, and in which the detector can be deactivated by biasing one detector deactivating plate to a negative potential and biasing the other detector deactivating plate to a positive potential so that charged particles will be attracted to the detector deactivating plates instead of striking the detector.

10. The charged-particle beam system of claim 9 in which the detector can be activated by biasing the detector deactivating plates to the substantially the same voltage as the detector.

11. The charged-particle beam system of claim 4 in which the first detector comprises a multi-channel plate located on the charged particle beam axis below a charged particle beam column in which the multi-channel plate is positioned above a pair of deactivating grids so that particles to be detected must pass said detector deactivating grids, and in which the detector can be deactivated by biasing one detector deactivating grid to a negative potential and biasing the other detector deactivating grid to a positive potential so that charged particles will be attracted to the detector deactivating grids instead of striking the detector.

12. The charged-particle beam system of claim 4 in which the first detector is of a first detector type having a signal gain of at least 1000×.

13. The charged-particle beam system of claim 4 in which the first detector comprises a scintillator-photomultiplier detector, a channeltron, or a solid-state detector.

14. The charged-particle beam system of claim 4 further comprising at least one additional detector of the first detector type.

15. The charged-particle beam system of claim 4 in which reactivating the first detector after the laser beam milling is complete and the particles generated by laser milling have dissipated comprises reactivating the first detector after the laser beam milling is complete and a delay period of 0.1 to 10 µs has expired.

16. The charged-particle beam system of claim 4 further comprising:
   a second detector of a second detector type for detecting particles emitted from the workpiece due to the impact of the laser beam, said second detector having a gain low enough that it will not be saturated by the particles generated by laser beam milling.

17. The charged-particle beam system of claim 16 further comprising:
   a second detector controller configured to activate the second detector before the laser beam is focused onto the sample and to deactivate the second detector after the laser beam milling is complete and the particles generated by laser milling have dissipated.

18. The charged-particle beam system of claim 16 in which the first detector controller is configured to reactivate the first detector upon receiving a signal from the second detector indicating that the particles generated by laser milling have dissipated.

19. The charged-particle beam system of claim 16 in which the first detector controller is configured to reactivate the first detector upon receiving a signal from the second detector indicating that the particles generated by laser milling have dissipated and a delay period of 0.1 to 10 µs has expired.

20. The charged-particle beam system of claim 16 in which said second detector type is a detector having a gain of 100× or less.

21. The charged-particle beam system of claim 16 comprising at least one additional detector of the second detector type and in which at least one additional detector of the second detector type is mounted close to the focus point of the laser beam but opposite the position of the second detector.

22. The charged-particle beam system of claim 21 in which said second detector is activated by biasing one of the second detector and the at least one additional detector of the second detector type to a negative voltage and the other to a positive voltage to create an electrical field parallel to the surface of the sample.

23. A charged-particle beam system, comprising:
a vacuum chamber;
a workpiece support for supporting a workpiece within the vacuum chamber;
an charged particle beam system including an charged particle source for generating charged particles and a focusing column for forming the charged particles into a beam having a sub-micron diameter at the workpiece;
a laser system for operating on the workpiece in the vacuum chamber, the laser system including a lens and generating a pulsed laser beam having an energy great enough to remove material from workpiece by laser beam milling;
the laser beam being focused onto the sample by a focusing element inside the vacuum chamber so that the laser beam and at least one of the charged particle beams are coincident on the sample;
a first detector for detecting secondary particles emitted from the workpiece due to the impact of the charged particle beam; and
a first detector controller configured to deactivate the first detector before the laser beam is focused onto the sample so that the first detector will not be saturated by particles generated by laser beam milling and to reactivate the first detector after the laser beam milling is complete and the particles generated by laser milling have dissipated.

24. The charged-particle beam system of claim 23 further comprising:
a second detector for detecting particles emitted from the workpiece due to the impact of the laser beam, said second detector having a gain low enough that it will not be saturated by the particles generated by laser beam milling.

25. The charged-particle beam system of claim 24 further comprising:
a second detector controller configured to activate the second detector before the laser beam is focused onto the sample and to deactivate the second detector after the laser beam milling is complete and the particles generated by laser milling have dissipated.

26. The charged-particle beam system of claim 24 in which the first detector controller is configured to reactivate the first detector upon receiving a signal from the second detector indicating that the particles generated by laser milling have dissipated.

27. A method for laser processing of a workpiece, comprising the steps of:
loading a workpiece into a system including a charged particle beam system and a laser system;
directing a charged particle beam onto the workpiece;
imaging the workpiece by using a first detector to detect secondary particles emitted from the workpiece due to the impact of the charged particle beam;
deactivating the first detector;
generating a pulsed laser beam with the laser system and focusing the laser beam onto the workpiece, the pulsed laser beam having an energy great enough to remove material from workpiece by laser beam milling, and the laser beam being focused onto the workpiece until a desired amount of material has been removed;
reactivating the first detector after the particles generated by laser milling have dissipated; and
redirecting the charged particle beam to image the workpiece.

28. The method of claim 27 further comprising:
after deactivating the first detector, detecting particles emitted from the workpiece due to the impact of the laser beam by using a second detector.

29. The method of claim 28 in which reactivating the first detector after the particles generated by laser milling have dissipated comprises reactivating the first detector upon receiving a signal from the second detector indicating that the particles generated by laser milling have dissipated.

30. The method of claim 28 in which the second detector is deactivated when the workpiece is imaged by the first detector and activated after the first detector is deactivated.

31. The method of claim 30 in which deactivating the second detector comprises placing a charge on the second detector so that charged particles emitted from the workpiece due to the impact of the charged particle beam will not be attracted to the second detector, and in which activating the second detector comprises placing a charge on the second detector so that charged particles produced during laser beam milling will be attracted to the second detector.

32. The method of claim 28 in which focusing the laser beam onto the workpiece until a desired amount of material has been removed comprises focusing the laser beam onto the workpiece until a signal is received from the second detector indicating that a milling endpoint has been reached.

33. The method of claim 27 in which deactivating the first detector comprises placing a charge on the first detector so that charged particles produced during laser beam milling will not be attracted to the first detector.

34. The method of claim 27 in which imaging the workpiece comprises beginning a raster scan with the charged particle beam until the laser beam is ready to fire and then stopping the scan of the charged particle beam, in which once the laser is ready the beam is focused onto the sample for a desired duration, and in which redirecting the charged particle beam to image the workpiece comprises restarting the scan at the same coordinates where scanning was stopped.

35. The method of claim 34 in which the sequence of steps is completed in less than 100 μs.

* * * * *